United States Patent
Kyono et al.

(10) Patent No.: US 8,884,306 B2
(45) Date of Patent: Nov. 11, 2014

(54) SEMICONDUCTOR DEVICE AND METHOD FOR MANUFACTURING THE SAME

(75) Inventors: Takashi Kyono, Itami (JP); Kuniaki Ishihara, Itami (JP); Akihiro Hachigo, Itami (JP); Takahisa Yoshida, Itami (JP); Masaki Ueno, Itami (JP); Makoto Kiyama, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 175 days.

(21) Appl. No.: 13/353,707

(22) Filed: Jan. 19, 2012

(65) Prior Publication Data

US 2012/0205661 A1    Aug. 16, 2012

(30) Foreign Application Priority Data

Feb. 15, 2011 (JP) ................... 2011-029867

(51) Int. Cl.
- H01L 29/15      (2006.01)
- H01L 31/0256    (2006.01)
- H01L 33/00      (2010.01)
- H01L 33/02      (2010.01)

(52) U.S. Cl.
CPC ............. *H01L 33/007* (2013.01); *H01L 33/025* (2013.01); *H01L 33/0079* (2013.01)
USPC ..................... 257/76; 257/E21.568

(58) Field of Classification Search
None
See application file for complete search history.

(56) References Cited

U.S. PATENT DOCUMENTS

2009/0221110 A1*    9/2009    Lee et al. ................. 438/46

FOREIGN PATENT DOCUMENTS

| CN | 1964090 A | 5/2007 |
|---|---|---|
| CN | 101315967 A | 12/2008 |
| CN | 101441999 A | 5/2009 |
| CN | 101589479 A | 11/2009 |
| JP | 2007-158334 | 6/2007 |
| JP | 2009-120465 | 6/2009 |
| JP | 2009-260391 | 11/2009 |
| JP | 2010-56100 | 3/2010 |
| JP | 2010-182936 | 8/2010 |
| JP | 2010-212719 | 9/2010 |
| JP | 2010-232625 | 10/2010 |
| WO | WO 2008/091010 | 7/2008 |

\* cited by examiner

*Primary Examiner* — Sonya D McCall Shepard
(74) *Attorney, Agent, or Firm* — Drinker Biddle & Reath LLP

(57) ABSTRACT

A semiconductor device includes a supporting substrate, a conductive layer placed on the supporting substrate, and at least one group III nitride semiconductor layer placed on the conductive layer. Of the group III nitride semiconductor layers, a conductive-layer-neighboring group III nitride semiconductor layer has n type conductivity, dislocation density of at most $1 \times 10^7$ cm$^{-2}$, and oxygen concentration of at most $5 \times 10^{18}$ cm$^{-3}$. Thus, an n-down type device having a semiconductor layer of high crystallinity can be provided.

2 Claims, 10 Drawing Sheets

SEMICONDUCTOR DEVICE AND METHOD FOR MANUFACTURING THE SAME

BACKGROUND OF THE INVENTION

1. Field of the Invention

The present invention relates to a semiconductor device and manufacturing method thereof and, more specifically, to a vertical semiconductor device having superior characteristics and to a method of manufacturing the same. Description of the

2. Background Art

Vertical semiconductor devices, including both light emitting devices and electronic devices, have characteristics that packaging is easy and area efficiency is high. As a method of manufacturing a vertical semiconductor device having such characteristics, a method of joining semiconductor layers grown on an underlying substrate to a supporting substrate different from the underlying substrate has been proposed.

By way of example, Japanese Patent Laying-Open No. 2010-212719 (PTL 1) discloses forming rugged patterns on a surface of a semiconductor layer (a surface of an n type semiconductor layer) after removing an underlying substrate from semiconductor layers grown on the underlying layer, to enhance light extraction efficiency.

Japanese Patent Laying-Open No. 2007-158334 (PTL 2) discloses growing semiconductor layers with an etching stop layer interposed, on an underlying substrate, so as to stop etching of a semiconductor layer after removing the underlying substrate at the etching stop layer, and thereby to reduce damage on the semiconductor layer (n type semiconductor layer) and to improve contact characteristic of an n side electrode.

Further, Japanese Patent Laying-Open No. 2010-232625 (PTL 3) discloses joining a group III nitride semiconductor layer on a supporting substrate with a buffer layer interposed, and removing the buffer layer by etching, to ease laser lift-off of the supporting substrate.

SUMMARY OF THE INVENTION

The light emitting devices manufactured by the methods disclosed in Japanese Patent Laying-Open No. 2010-212719 (PTL 1), Japanese Patent Laying-Open No. 2007-158334 (PTL 2) and Japanese Patent Laying-Open No. 2010-232625 (PTL 3) are all p-down type light emitting devices in which among the semiconductor layers, a p type semiconductor layer is bonded to the supporting substrate, and the underlying substrate is separated from an n type semiconductor layer. Such separation degrades the n type semiconductor layer, and its surface becomes rough. Since it is difficult to bond the supporting substrate to the n type semiconductor layer having a rough surface, it is difficult by the methods disclosed in PTLs 1 to 3 to manufacture a n-down type semiconductor device in which an n type semiconductor layer is bonded to a supporting substrate.

Further, according to the method disclosed in PTL 2, since the etching stop layer having unique characteristics is interposed between the underlying layer and the semiconductor layer, crystallinity of n type GaN layer, active layer and p type GaN layer to be grown on the semiconductor layer lowers, resulting in lower performance of the semiconductor device.

It is an object of the present invention to solve the above-described problem and to provide an n-down type semiconductor device having a semiconductor layer of high crystallinity and high bonding characteristic to a supporting substrate.

The present invention provides a semiconductor device, including: a supporting substrate; a conductive layer placed on the supporting substrate; and at least one group III nitride semiconductor layer placed on the conductive layer; wherein of the group III nitride semiconductor layers, a conductive-layer-neighboring group III nitride semiconductor layer adjacent to the conductive layer has n type conductivity, dislocation density of at most $1 \times 10^7$ cm$^{-2}$, and oxygen concentration of at most $5 \times 10^{18}$ cm$^{-3}$.

In the semiconductor device in accordance with the present invention, the conductive-layer-neighboring group III nitride semiconductor layer may have oxygen concentration of at most $5 \times 10^{17}$ cm$^{-3}$. The conductive-layer-neighboring group III nitride semiconductor layer may contain Al as a group III element forming the group III nitride.

According to an aspect, the present invention provides a method of manufacturing a semiconductor device, including the steps of: preparing a first composite substrate having an underlying layer joined to a first group III nitride semiconductor layer; growing, on the first group III nitride semiconductor layer of the first composite substrate, at least one second group III nitride semiconductor layer; joining a temporary supporting substrate to the second group III nitride semiconductor layer to form a second composite substrate; removing the underlying layer from the second composite substrate; forming a conductive layer on the first group III nitride semiconductor layer; joining a supporting substrate to the conductive layer to form a third composite substrate; and removing the temporary supporting substrate from the third composite substrate; wherein the first group III nitride semiconductor layer has n type conductivity, dislocation density of at most $1 \times 10^7$ cm$^{-2}$, and oxygen concentration of at most $5 \times 10^{18}$ cm$^{-3}$.

According to another aspect, the present invention provides a method of manufacturing a semiconductor device, including the steps of: preparing a first composite substrate having an underlying layer joined to a first group III nitride semiconductor layer; growing, on the first group III nitride semiconductor layer of the first composite substrate, at least one second group III nitride semiconductor layer; joining a temporary supporting substrate to the second group III nitride semiconductor layer to form a second composite substrate; removing the underlying layer from the second composite substrate; removing the first group III nitride semiconductor layer; forming a conductive layer on the second group III nitride semiconductor layer; joining a supporting substrate to the conductive layer to form a fourth composite substrate; and removing the temporary supporting substrate from the fourth composite substrate;

wherein of the second group III nitride semiconductor layers, a conductive-layer-neighboring group III nitride semiconductor layer adjacent to the conductive layer has n type conductivity, dislocation density of at most $1 \times 10^7$ cm$^{-2}$, and oxygen concentration of at most $5 \times 10^{17}$ cm$^{-3}$.

By the present invention, an n-down type semiconductor device having a semiconductor layer of high crystallinity and high bonding characteristic to a supporting substrate can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[Semiconductor Device]
(Embodiment 1)

Figure 1:
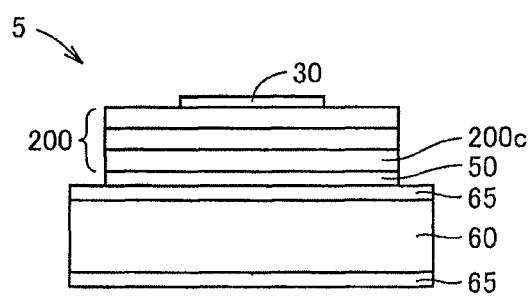
FIG. 1 is a schematic cross-sectional view showing an example of a semiconductor device in accordance with the present invention.

Referring to FIG. 1, a semiconductor device 5 in accordance with an embodiment of the present invention includes a supporting substrate 60, a conductive layer 50 placed on supporting substrate 60, and at least one group III nitride semiconductor layer 200 placed on conductive layer 50, and among the group III nitride semiconductor layers 200, a conductive-layer-neighboring group III nitride semiconductor layer 200c adjacent to conductive layer 50 has n type conductivity, dislocation density of at most $1 \times 10^7$ cm$^{-2}$, and oxygen concentration of at most $5 \times 10^{18}$ cm$^{-3}$.

Semiconductor device 5 in accordance with the present embodiment is an n-down type semiconductor device, since the conductive-layer-neighboring group III semiconductor layer 200c is of n type conductivity, and since it has dislocation density of at most $1 \times 10^7$ cm$^{-2}$ and oxygen concentration of at most $5 \times 10^{18}$ cm$^{-3}$, group III nitride semiconductor layer 200 including such conductive-layer-neighboring group III semiconductor layer 200c has high crystallinity and superior bonding characteristic to supporting substrate 60.

(Supporting Substrate)

Supporting substrate 60 in semiconductor device 5 in accordance with the present embodiment is not specifically limited and any substrate suitable for supporting group III nitride semiconductor layer 200 of semiconductor device 5 may be used. From the viewpoint of high light permeability, a supporting substrate of sapphire or a supporting substrate of spinel is preferred. From the viewpoint of conductivity, an Si supporting substrate or a supporting substrate of group III nitride is preferred. From the viewpoint of realizing thermal expansion coefficient equal to or approximately equal to that of group III nitride semiconductor layer 200, a supporting substrate of group III nitride or an SiC supporting substrate is preferred. Supporting substrate 60 may be a single crystal substrate or a polycrystalline substrate. Further, from the viewpoint of increasing bonding strength between supporting substrate 60 and conductive layer 50, which will be described later, a surface conductive layer 65 may be formed on a surface of supporting substrate 60. Here, surface conductive layer 65 and conductive layer 50, which will be described later, should preferably have the same or similar chemical composition.

(Conductive Layer)

Conductive layer 50 in semiconductor device 5 in accordance with the present embodiment is not specifically limited, provided that it can serve as an electrode of semiconductor device 5. From the viewpoint of lowering contact resistance, a metal layer such as an Al layer, a W layer or a Hf layer is preferred, and if light permeability is desired, a conductive oxide layer such as an ITO (Indium Tin Oxide) layer or a ZnO (Zinc Oxide) layer is preferred. Further, in order to improve adhesiveness and/or to form a pad electrode, a metal layer such as Ti and/or Au may be included.

(Group III Nitride Semiconductor Layer)

At least one group III nitride semiconductor layer 200 in semiconductor device 5 in accordance with the present embodiment is formed to express the functions of semiconductor device 5. If semiconductor device 5 is an electronic device, group III nitride semiconductor layer 200 may include, for example, an n$^+$ semiconductor layer or an n$^-$ semiconductor layer. If semiconductor device 5 is a light emitting device, group III nitride semiconductor layer 200 may include, for example, a light emitting layer, an electron blocking layer, a contact layer and the like.

Further, of the group III nitride semiconductor layers 200, conductive-layer-neighboring group III nitride semiconductor layer 200c adjacent to conductive layer 50 has n type conductivity, dislocation density of at most $1 \times 10^7$ cm$^{-2}$, and oxygen concentration of at most $5 \times 10^{18}$ cm$^{-3}$. Since conductive-layer-neighboring group III nitride semiconductor layer 200c has n type conductivity, semiconductor device 5 is an n-down type semiconductor device. Since conductive-layer-neighboring group III nitride semiconductor layer 200c has high crystallinity as represented by dislocation density of at most $1 \times 10^7$ cm$^{-2}$ and oxygen concentration of at most $5 \times 10^{18}$ cm$^{-3}$, group III nitride semiconductor layer 200 including the conductive-layer-neighboring group III nitride semiconductor layer 200c has high crystallinity. Further, since conductive-layer-neighboring group III nitride semiconductor layer 200c as such has high flatness on the surface to be bonded to conductive layer 50, it attains superior bonding characteristics to conductive layer 50.

Here, conductive-layer-neighboring group III nitride semiconductor layer 200c having high crystallinity as represented by dislocation density of at most $1 \times 10^7$ cm$^{-2}$ and oxygen concentration of at most $5 \times 10^{18}$ cm$^{-3}$ cannot be obtained by growing on a buffer layer posed on an underlying substrate of which chemical composition is not the same or similar to the chemical composition of the group III nitride forming the layer. If a buffer layer is formed on the underlying substrate as such and the group III nitride semiconductor is grown thereon, at the initial stage of growth, three-dimensional growth (non-planar growth, such as growth using the main surface and a facet as crystal growth surfaces; the same applies in the following) occurs and, hence, the grown group III nitride semiconductor layer comes to have high dislocation density and high oxygen concentration, as much oxygen is taken in. Therefore, it is necessary to form the conductive-layer-neighboring group III nitride semiconductor layer 200c by using a group III nitride semiconductor substrate having dislocation density of at most $1\times10^7$ cm$^{-2}$ and oxygen concentration of at most $5\times10^{18}$ cm$^{-3}$ cut out from a group III nitride semiconductor ingot grown by using a different underlying layer (for example, an underlying layer having the same or similar chemical composition as the group III nitride semiconductor to be formed, though not limiting).

From the viewpoint of further improving the crystallinity of group III nitride semiconductor layer 200 and to further improve bonding characteristics to supporting substrate 60, oxygen concentration of conductive-layer-neighboring group III nitride semiconductor layer 200c should preferably be at most $5\times10^{17}$ cm$^{-3}$.

It is noted that it is difficult to grow conductive-layer-neighboring group III nitride semiconductor layer 200c having oxygen concentration of at most $5\times10^{17}$ cm$^{-3}$ directly on the underlying substrate having the same or similar chemical composition as the group III nitride forming the same, and that it is suitably obtained by further growing on a group III nitride semiconductor layer formed on such an underlying substrate. Further, the group III nitride semiconductor layer having lower oxygen concentration has higher degree of two-dimensional growth (planar growth, such as growth using the main surface as the crystal growth surface; the same applies in the following) than the three-dimensional growth and, as a result, surface flatness and crystallinity of a portion to be in contact with conductive layer 50 come to be higher. Thus, uniform and satisfactory ohmic characteristic can more easily be attained in a plane parallel to the main surface.

Further, from the viewpoint of reducing damage caused, for example, by etching during manufacturing, conductive-layer-neighboring group III nitride semiconductor layer 200c should preferably include Al as the group III element forming the group III nitride. Since Al—N bonding is stronger than Ga—N bonding, damage can be reduced.

[Method of Manufacturing a Semiconductor Device]
(Embodiment 2)

Figure 2:
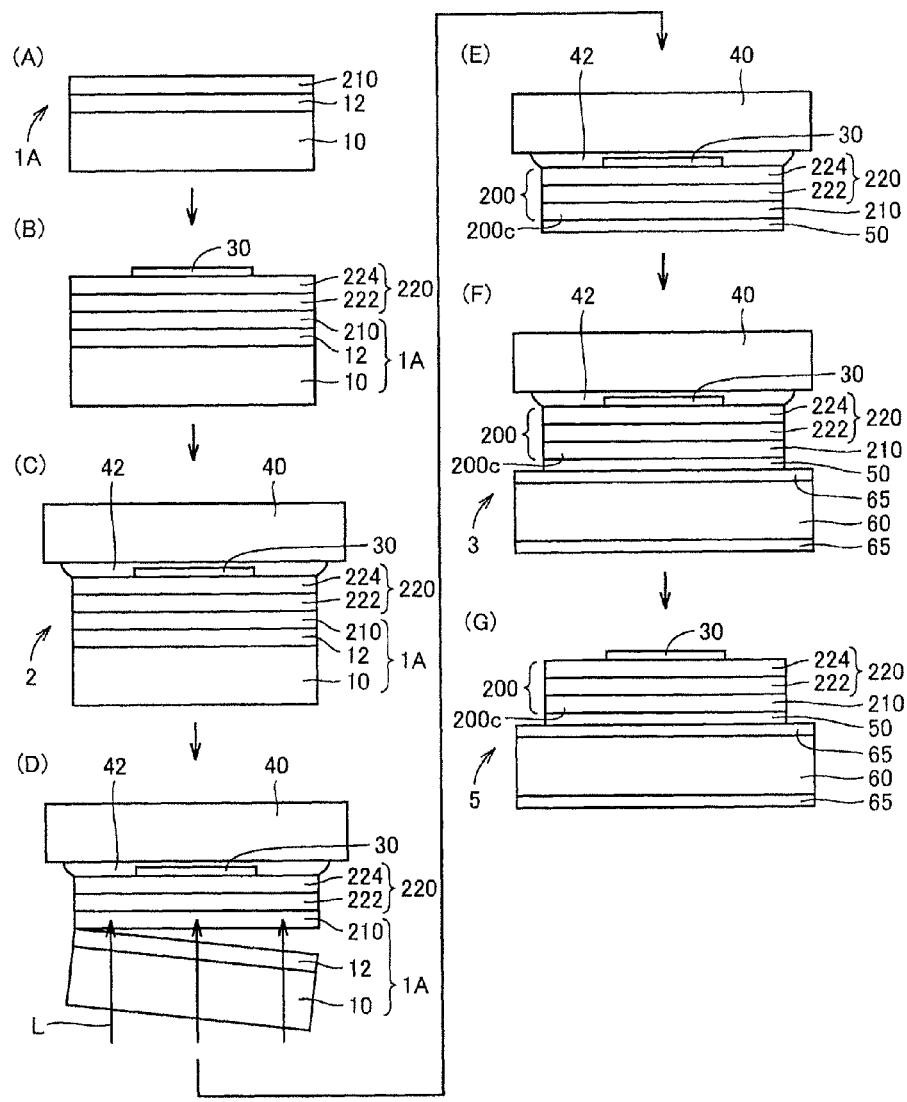
FIG. 2 is a schematic cross-sectional view showing an example of a method of manufacturing the semiconductor device in accordance with the present invention.
Figure 3:
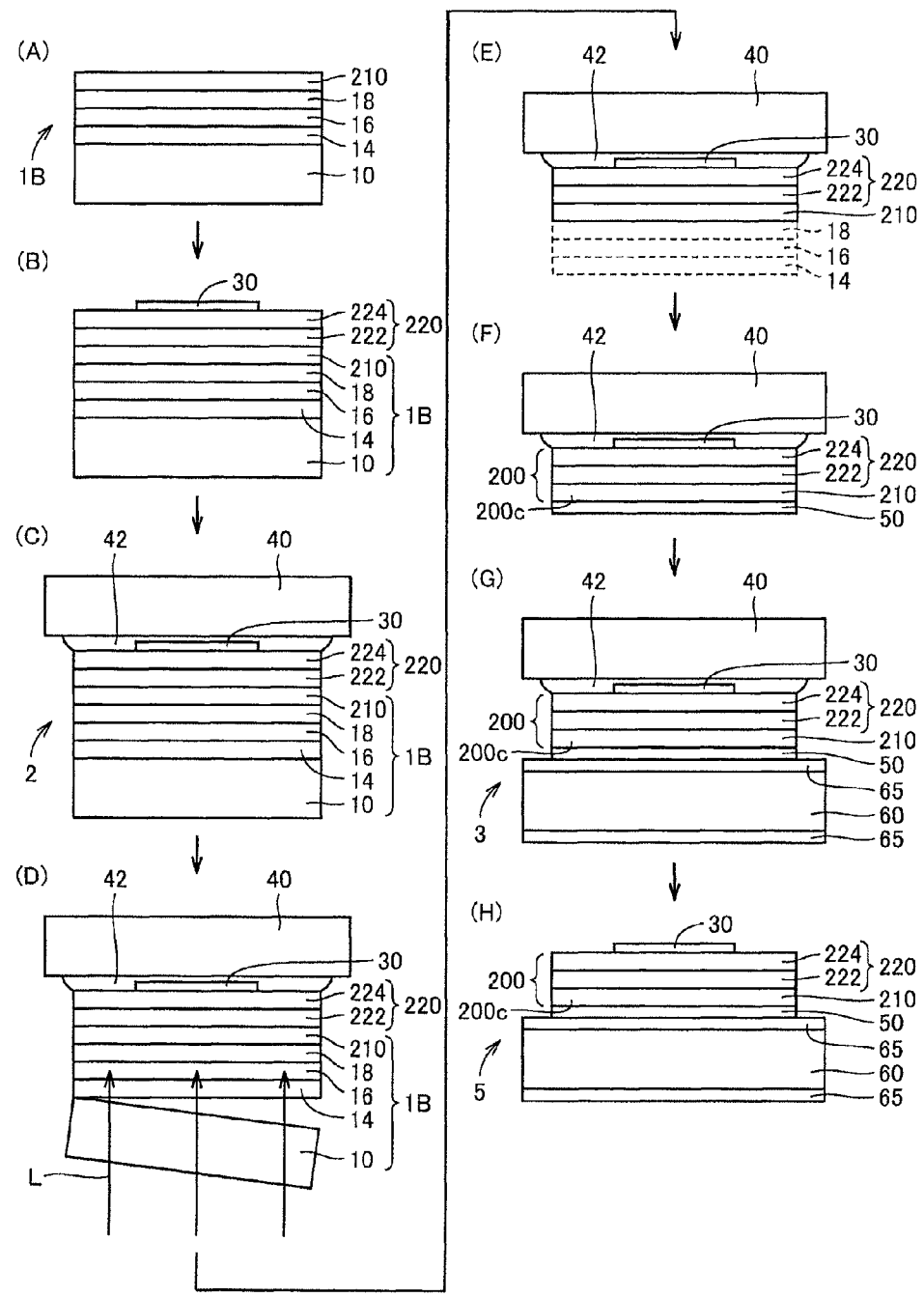
FIG. 3 is a schematic cross-sectional view showing another example of a method of manufacturing the semiconductor device in accordance with the present invention.
Figure 6:
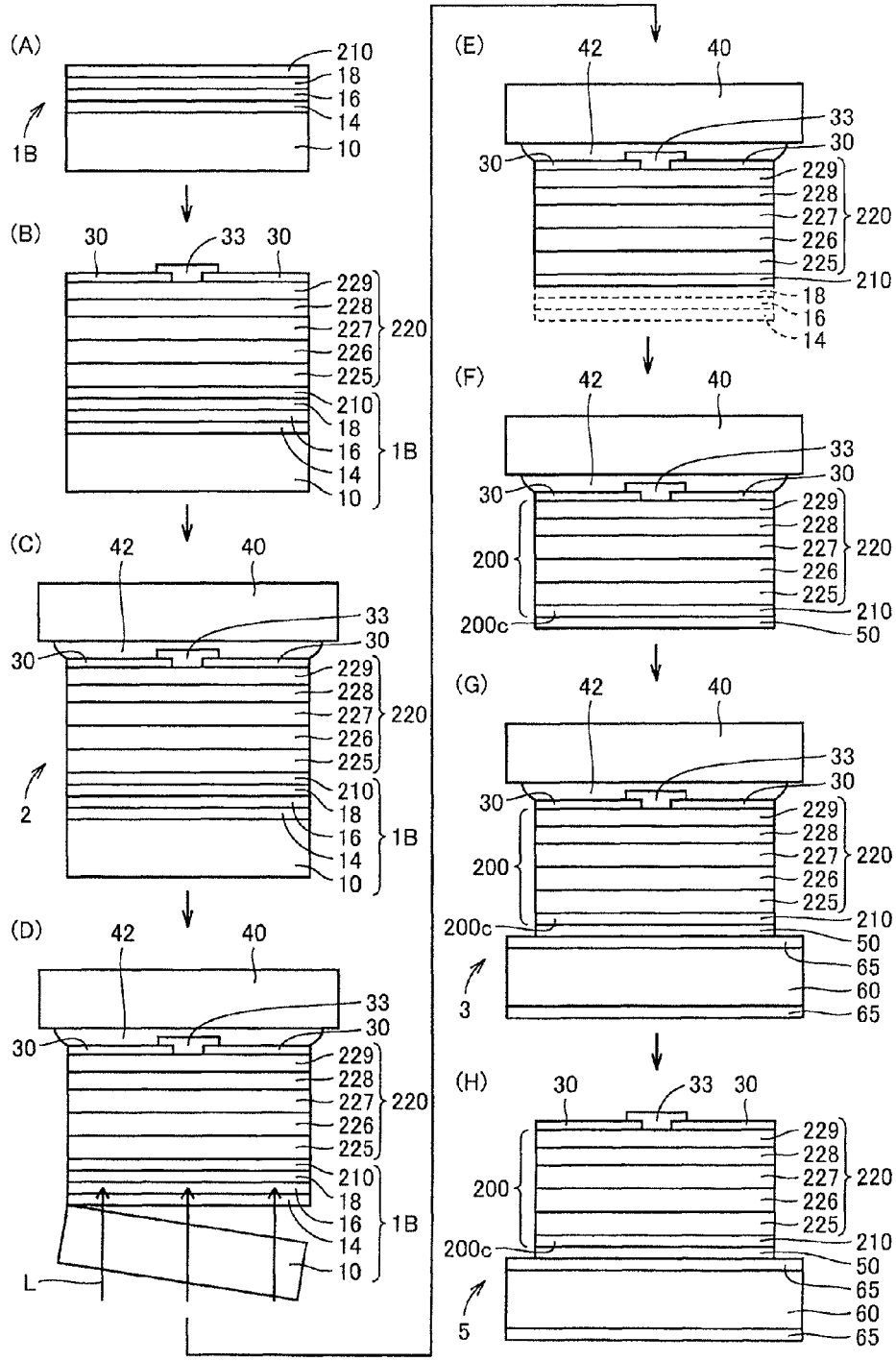
FIG. 6 is a schematic cross-sectional view showing a yet another example of a method of manufacturing the semiconductor device in accordance with the present invention.

Referring to FIGS. 2, 3 and 6, the method of manufacturing a semiconductor device 5 in accordance with another embodiment of the present invention includes the steps of: preparing a first composite substrate 1A, 1B having a first group III nitride semiconductor layer 210 joined to an underlying substrate 10 ((A) in FIGS. 2, 3 and 6); growing at least one second group III nitride semiconductor layer 220 on the first group III nitride semiconductor layer 210 of the first composite substrate 1A, 1B ((B) in FIGS. 2, 3 and 6); forming a second composite substrate 2 by joining a temporary supporting substrate 40 to the second group III nitride semiconductor layer 220 ((C) of FIGS. 2, 3 and 6); removing underlying substrate 10 from the second composite substrate 2 ((D) of FIGS. 2, 3 and 6); forming conductive layer 50 on the first group III nitride semiconductor layer 210 ((E) in FIG. 2, (F) in FIGS. 3 and 6); forming a third composite substrate 3 by joining supporting substrate 60 to conductive layer 50 ((F) in FIG. 2, (G) in FIGS. 3 and 6); and removing temporary supporting substrate 40 from the third composite substrate 3 ((G) in FIG. 2, (H) in FIGS. 3 and 6). Here, the first group III nitride semiconductor layer 210 mentioned above has n type conductivity, dislocation density of at most $1\times10^7$ cm$^{-2}$ and oxygen concentration of at most $5\times10^{18}$ cm$^{-3}$.

According to the method of manufacturing a semiconductor device of the present embodiment, since the first group III nitride semiconductor layer 210 has n type conductivity, dislocation density of at most $1\times10^7$ cm$^{-2}$ and oxygen concentration of at most $5\times10^{18}$ cm$^{-3}$, it is possible to grow at least one second group III nitride semiconductor layer 220 having high crystallinity on the first group III nitride semiconductor layer 210 and, after underlying substrate 10 is removed from the first group III nitride semiconductor layer 210, the surface of first group III nitride semiconductor layer 210 has high flatness. Thus, bonding characteristic between the first group III nitride semiconductor layer 210 and conductive layer 50 can be improved.

(Step of Preparing the First Composite Substrate)

Referring to (A) of FIGS. 2, 3 and 6, the step of preparing the first composite substrate 1A or 1B is not specifically limited. From the viewpoint of improving bonding characteristic and of facilitating separation between underlying substrate 10 and the first group III nitride semiconductor layer 210, sub-steps shown in FIGS. 7 and 8 should preferably be included.

(First Composite Substrate 1A)

Figure 7:
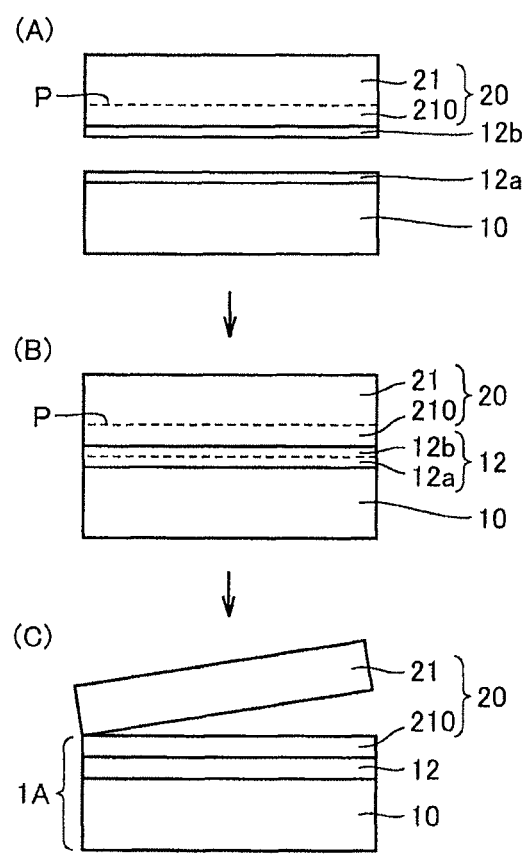
FIG. 7 is a schematic cross-sectional view showing an example of a method of manufacturing a first composite substrate used in the method of manufacturing the semiconductor device in accordance with the present invention.

Referring to FIG. 7, the step of preparing the first composite substrate 1A will be described in the following. First, referring to FIG. 7(A), the process includes a sub-step of forming an SiO$_2$ layer 12a on underlying substrate 10 and, after formation of an SiO$_2$ layer 12b on one main surface of group III nitride semiconductor layer 20, implanting ions to a plane P at a prescribed depth from the main surface to make fragile the region of plane P. Though underlying substrate 10 is not specifically limited here, from the viewpoint of preventing generation of any crack in the first group III nitride semiconductor layer 210 when the second group III nitride semiconductor layer 220 is grown on the first group III nitride semiconductor layer 210, it is preferably a group III nitride underlying substrate having the same or similar chemical composition as the first group III nitride semiconductor layer 210. Further, if underlying substrate 10 is to be removed by laser lift-off at a subsequent process step, in order to have the laser beam passed through underlying substrate 10 and absorbed by the first group III nitride semiconductor layer 210, a sapphire underlying substrate, a spinel underlying substrate or a gallium oxide underlying substrate may be preferred. The method of forming an SiO$_2$ layer 12a or 12b is not specifically limited, and plasma CVD (Chemical Vapor Deposition), sputtering, vacuum deposition or the like may appropriately be selected.

Next, referring to FIG. 7(B), the method includes the sub-step of joining SiO$_2$ layer 12a formed on underlying substrate 10 and SiO$_2$ layer 12b formed on group III nitride semiconductor substrate 20. By this joining, the two SiO$_2$ layers 12a and 12b are integrated to be an SiO$_2$ layer 12. Here, the method of joining is not specifically limited, and direct bonding method of cleaning the surfaces to be joined, directly joining the surfaces and then heating to 700° C. to 1000° C. for bonding, an alloy junction method of forming a metal film, heating the film while it is in contact to form an alloy of the metal to attain joining, or a surface activation method of activating the joining surfaces by plasma or ions to attain bonding may preferably be used.

Next, referring to (B) and (C) of FIG. 7, the substrate obtained by joining underlying substrate 10 and group III nitride semiconductor substrate 20 with SiO$_2$ layer 12 interposed is subjected to heat and/or stress. Thus, group III nitride semiconductor substrate 20 is divided to the first group III nitride semiconductor layer 210 and the remaining group III nitride semiconductor layer 21 at the plane P that has been made fragile by ion implantation. As a result, the first composite substrate 1A having group III nitride semiconductor layer 210 joined to underlying substrate 10 with SiO$_2$ layer 12 interposed is obtained.

(First Composite Substrate 1B)

Figure 8:
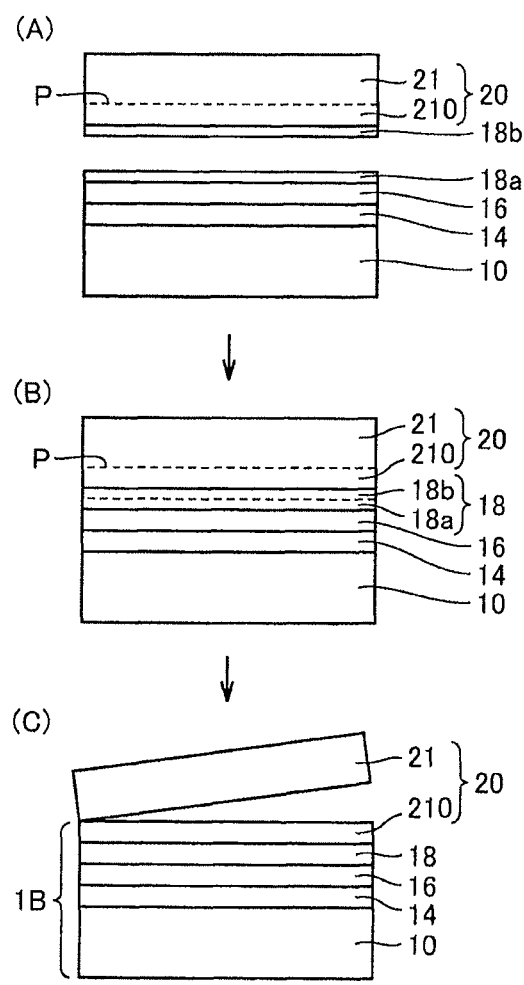
FIG. 8 is a schematic cross-sectional view showing another example of a method of manufacturing a first composite substrate used in the method of manufacturing the semiconductor device in accordance with the present invention.

Referring to FIG. 8, the step of preparing the first composite substrate 1B will be described in the following. First, referring to FIG. 8(A), the process includes a sub-step of successively forming a first $SiO_2$ layer 14, an amorphous Si layer 16 and a second $SiO_2$ layer 18a on underlying substrate 10, and a sub-step of forming a second $SiO_2$ layer 18b on one main surface of group III nitride semiconductor substrate 20 and making fragile a region of plane P by implanting ions to the plane P at a prescribed depth from the main surface. Though underlying substrate 10 is not specifically limited here, from the viewpoint of preventing generation of any crack in the first group III nitride semiconductor layer 210 when the second group III nitride semiconductor layer 220 is grown on the first group III nitride semiconductor layer 210, it is preferably a group III nitride underlying substrate having the same or similar chemical composition as the first group III nitride semiconductor layer 210. The methods of forming the first $SiO_2$ layer 14, amorphous Si layer 16 and the second $SiO_2$ layers 18a and 18b are not specifically limited, and plasma CVD (Chemical Vapor Deposition), sputtering or vacuum vapor deposition may appropriately be used.

Next, referring to FIG. 8(B), the process includes the sub-step of joining the second $SiO_2$ layer 18a formed on underlying substrate 10 with the first $SiO_2$ layer 14 and amorphous Si layer 16 interposed with the second $SiO_2$ layer 18b formed on group III nitride semiconductor layer 20. By this joining, the two $SiO_2$ layers 18a and 18b are integrated to be the second $SiO_2$ layer 18. Here, the method of joining is not specifically limited, and direct bonding method of cleaning the surfaces to be joined, directly joining the surfaces and then heating to 700° C. to 1000° C. for bonding, an alloy junction method of forming a metal film, heating the film while it is in contact to form an alloy of the metal to attain joining, or a surface activation method of activating the joining surfaces by plasma or ions to attain bonding may preferably be used.

Next, referring to (B) and (C) of FIG. 8, the substrate obtained by joining group III nitride semiconductor substrate 20 and underlying substrate 10 with the first $SiO_2$ layer 14, amorphous Si layer 16 and the second $SiO$, layer 18 interposed is subjected to heat and/or stress. Thus, group III nitride semiconductor substrate 20 is divided to the first group III nitride semiconductor layer 210 and the remaining group III nitride semiconductor layer 21 at the plane P that has been made fragile by ion implantation. As a result, the first composite substrate 1B having the first group III nitride semiconductor layer 210 joined to underlying substrate 10 with the first $SiO_2$ layer 14, amorphous Si layer 16 and the second $SiO_2$ layer 18 interposed can be obtained.

Here, the first group III nitride semiconductor layer 210 in the first composite substrate 1A, 1B has n type conductivity, dislocation density of at most $1 \times 10^7$ $cm^{-2}$, and oxygen concentration of at most $5 \times 10^{18}$ $cm^{-3}$. Since the first group III nitride semiconductor layer 210 has n type conductivity, manufacturing of an n-down type semiconductor device having the n type semiconductor layer supported by the supporting substrate becomes easier. Since the first group III nitride semiconductor layer 210 has dislocation density of at most $1 \times 10^7$ $cm^{-2}$ and oxygen concentration of at most $5 \times 10^{18}$ $cm^{-3}$, at least one second group III nitride semiconductor layer 220 having high crystallinity can be grown thereon.

The first group III nitride semiconductor layer 210 having high crystallinity as represented by dislocation density of at most $1 \times 10^7$ $cm^{-2}$ and oxygen concentration of at most $5'10^{18}$ $cm^{-3}$ cannot be obtained by growing on a buffer layer posed on an underlying substrate of which chemical composition is not the same or similar to the chemical composition of the group III nitride forming the layer. If a buffer layer is formed on the underlying substrate as such and the group III nitride semiconductor is grown thereon, at the initial stage of growth, three-dimensional growth occurs and, hence, the grown group III nitride semiconductor layer comes to have high dislocation density and high oxygen concentration, as much oxygen is taken in. Generally, as the group III nitride semiconductor layer grows, two-dimensional growth becomes gradually dominant than the three-dimensional growth and, therefore, in the middle to late stage of the growth, the dislocation density and the oxygen concentration decrease. Therefore, it is necessary to fabricate the first composite substrate 1A or 1B in accordance with the present embodiment, by joining the group III nitride semiconductor substrate having dislocation density of at most $1 \times 10^7$ $cm^{-2}$ and oxygen concentration of at most $5 \times 10^{18}$ $cm^{-3}$ cut out from a group III nitride semiconductor ingot grown by using a different underlying substrate (for example, an underlying substrate having the same or similar chemical composition as the group III nitride to be grown, though not limiting) with the underlying substrate 10 of the present embodiment.

(Step of Growing the Second Group III Nitride Semiconductor)

Referring to (B) of FIGS. 2, 3 and 6, at the step of growing the second group III nitride semiconductor layer 220, the method of growth is not specifically limited, provided that at least one second group III nitride semiconductor layer 220 can be epitaxially grown on the first group III nitride semiconductor layer 210. Gas phase method such as MOVPE (Metal Oxide Vapor Phase Epitaxy), HVPE (Hydride Vapor Phase Epitaxy), MBE (Molecular Beam Epitaxy) and sublimation technique, and liquid phase method such as flux method and high nitrogen pressure solution technique may suitably be used.

The second group III nitride semiconductor layer 220 obtained at the step of growing the second group III nitride semiconductor layer 220 has high crystallinity, since it is epitaxially grown on the first group III nitride semiconductor layer 210 having high crystallinity as represented by the dislocation density of at most $1 \times 10^7$ $cm^{-2}$ and oxygen concentration of at most $5 \times 10^{18}$ $cm^{-3}$.

(Step of Forming Electrode)

After the step of growing the second group III nitride semiconductor layer 220, the step of alining an electrode 30 (electrode forming step) on the outermost layer of the second group III nitride semiconductor layer may be included.

(Step of Forming the Second Composite Substrate)

Referring to (C) of FIGS. 2, 3 and 6, at the step of forming the second composite substrate 2, the method of joining the second group III nitride semiconductor layer 220 and temporary supporting substrate 40 is not specifically limited, provided that the second group III nitride semiconductor layer 220 can satisfactorily be supported by temporary supporting substrate 40 and that temporary supporting substrate 40 can easily be removed from the second group III nitride semiconductor layer 220 at a subsequent process step. By way of example, joining with wax 42 is a suitable method. By using wax 42, for example, the second group III nitride semiconductor layer 220 and temporary supporting substrate 40 can reliably be joined, even if electrode 30 is formed on the outermost layer of the second group III nitride semiconductor layer 220.

Here, temporary supporting substrate 40 is not specifically limited, provided that it can satisfactorily support the second group III nitride semiconductor layer 220, and a temporary supporting substrate of sapphire, a temporary supporting substrate of Si or a temporary supporting substrate of group III nitride semiconductor may suitably be used.

By joining temporary supporting substrate 40 to the second group III nitride semiconductor layer 220 in the above-described manner, the second composite substrate 2 is obtained.

(Step of Removing Temporary Substrate)

Referring to (C) and (D) of FIGS. 2, 3 and 6, at the step of removing underlying substrate 10, the method of removing underlying substrate 10 from the second composite substrate 2 is not specifically limited. From the viewpoint of efficient removal, however, laser lift-off method is preferred. The laser lift method refers to a method of irradiating the composite substrate with a laser beam to partially decompose a layer or layers forming the composite substrate and thereby to separate part of the composite substrate.

Here, because of the difference in structure of the first composite substrates 1A and 1B included in the second composite substrate 2, the type of laser beam used in the laser lift-off, the position of separation and the mechanism of separation differ. Details will be described in the following.

(If the Second Composite Substrate 2 Includes the First Composite Substrate 1A)

Referring to FIG. 2(C), the second composite substrate 2 including the first composite substrate 1A has a structure including the underlying substrate 10, $SiO_2$ layer 12, the first group III nitride semiconductor layer 210 and the second group III nitride semiconductor layer 220 stacked in this order. Such a structure is suitably adopted when underlying substrate 10 is a substrate that does not absorb the light of wavelength absorbed by the first and second group III nitride semiconductor layers 210 and 220, for example, when it is a sapphire underlying substrate, a spinel underlying substrate or a gallium oxide underlying substrate.

Referring to (C) and (D) of FIG. 2, consider, for example, the second composite substrate 2 including the first composite substrate 1A including a sapphire underlying substrate as underlying substrate 10. Here, the underlying substrate 10 is lift-off in the following manner. The side of underlying substrate 10 of the second composite substrate 2 is irradiated with light having the wavelength not absorbed by underlying substrate 10 or $SiO_2$ layer 12 but absorbed by the first group III nitride semiconductor layer 210, for example, THG (third harmonic generation)-YAG (Yttrium·Aluminum·Garnet) laser beam having the wavelength of 355 nm. Part of the first group III nitride semiconductor layer 210 that absorbed the THG-YAG laser beam decomposes, whereby the underlying substrate 10 and $SiO_2$ layer 12 are lift-off from the first group III nitride semiconductor layer 210.

(If the Second Composite Substrate 2 Includes the First Composite Substrate 1B)

Referring to (C) of FIGS. 3 and 6, the second composite substrate 2 including the first composite substrate 1B has a structure including the underlying substrate 10, the first $SiO_2$ layer 14, amorphous Si layer 16, the second $SiO_2$ layer 18, the first group III nitride semiconductor layer 210 and the second group III nitride semiconductor layer 220 stacked in this order. Such a structure is suitably adopted when the underlying substrate 10 is a substrate that absorbs the light of wavelength absorbed by the first and second group III nitride semiconductor layers 210 and 220, for example, when it is a group III nitride underlying substrate.

Referring to (C) and (D) of FIGS. 3 and 6, consider, for example, the second composite substrate 2 including the first composite substrate 1B including the group III nitride underlying substrate as underlying substrate 10. Here, the underlying substrate 10 is lift-off in the following manner. The side of underlying substrate 10 of the second composite substrate 2 is irradiated with light having the wavelength not absorbed by underlying substrate 10 or $SiO_2$ layers 14, 18 but absorbed by the amorphous Si layer 16, for example, SHG (second harmonic generation)-YAG (Yttrium·Aluminum·Garnet) laser beam having the wavelength of 532 nm. The SHG-YAG laser beam is absorbed by amorphous Si layer 16 and converted to heat, and by the heat, part of the underlying substrate 10 in contact with the first SiO layer 14 decomposes, whereby the underlying substrate 10 is lift-off from the first SiO layer 14.

Here, in order to have a part of group III nitride underlying substrate as the underlying substrate 10 decomposed while not decomposing part of the first group III nitride semiconductor layer 210 by the heat converted at amorphous layer 16, it is preferred that the first $SiO_2$ layer 14 is made thinner than the second $SiO_2$ layer 18.

As described above, in the second composite substrate 2 including the first composite substrate 1A, underlying substrate 10 is removed by decomposing part of the first group III nitride semiconductor layer 210, while in the second composite substrate 2 including the first composite substrate 1B, underlying substrate 10 is removed by decomposing part of underlying substrate 10. Therefore, it is preferable to maintain high crystallinity of the first group III nitride semiconductor layer 210.

In the second composite substrate 2 including the first composite substrate 1B, underlying substrate 10 is lift-off from the first $SiO_2$ layer 14 and, therefore, on the first group III nitride semiconductor layer 210, the second $SiO_2$ layer 18, amorphous layer 16 and the first $SiO_2$ layer 14 are left.

Therefore, referring to (E) of FIGS. 3 and 6, for the subsequent process step, the second $SiO_2$ layer 18, amorphous layer 16 and the first $SiO_2$ layer 14 left on the first group III nitride semiconductor layer 210 are removed. The method of removing these layers is not specifically limited, and wet etching using a mixed solution of hydrofluoric acid and nitric acid, or dry etching such as RIE (Reactive Ion Etching) may be suitably used.

(Step of Forming Conductive Layer)

Referring to (E) of FIG. 2 and (F) of FIGS. 3 and 6, at the step of forming conductive layer 50, the method of forming conductive layer 50 on the first group III nitride semiconductor layer 210 is not specifically limited, as long as it is suitable for forming conductive layer 50. Sputtering, vacuum deposition or the like may suitably be used.

Here, conductive layer 50 is not specifically limited. From the viewpoint of lowering contact resistance, however, a metal layer such as an Al layer, a W layer or an Hf layer is preferred, and if light permeability is desired, a conductive oxide layer such as an ITO (Indium Tin Oxide) layer or a ZnO (Zinc Oxide) layer is preferred. For improving adhesiveness and/or for forming a pad electrode, it may include a metal layer such as Ti and/or Au, By way of example, an Al/Ti/Au layer stacking these metal films may suitably be used.

(Step of Forming Third Composite Substrate)

Referring to (F) of FIG. 2 and (G) of FIGS. 3 and 6, at the step of forming the third composite substrate 3, the method of joining supporting substrate 60 to conductive layer 50 is not specifically limited, provided that reliable joining to conductive layer 50 is ensured and conductive layer 50 and the first and second group III nitride semiconductor layers 210 and 220 are satisfactorily supported. By way of example, solder bonding of bonding joining surfaces with solder, direct bonding method of cleaning the surfaces to be joined, directly joining the surfaces and then heating to 700° C. to 1000° C. for bonding, or a surface activation method of activating the joining surfaces by plasma or ions to attain bonding may preferably be used.

Further, supporting substrate 60 is not specifically limited, provided that it can reliably be bonded to conductive layer 50 and satisfactorily support conductive layer 50 and the first and second group III nitride semiconductor layers 210 and 220. From the viewpoint of high light permeability and high light extraction efficiency, a supporting substrate formed of sapphire or a supporting substrate formed of spinel is preferred. From the viewpoint of conductivity required of a vertical semiconductor device, a supporting substrate of Si or a supporting substrate of group III nitride is preferred. From the viewpoint of attaining the same or similar thermal expansion coefficient as the first and second group III nitride semiconductor layers 210 and 220, a supporting substrate of group III nitride, or a supporting substrate of SiC is preferred. Supporting substrate 60 may be a single crystal or polycrystalline substrate.

From the viewpoint of enhancing bonding characteristic to conductive layer 50, supporting substrate 60 preferably has a surface conductive layer 65 fowled on its surface. Though surface conductive layer 65 of supporting substrate 60 is not specifically limited, preferably, it has the same or similar chemical composition as conductive layer 50. For a vertical semiconductor device, it is preferred that supporting substrate 60 and surface conductive layer 65 form ohmic contact. By way of example, if conductive layer 50 is an Al/Ti/Au layer and supporting substrate 60 is an Si supporting substrate, surface conductive layer 65 should preferably be an alloy layer of Al/Ti/Au.

By joining supporting substrate 60 to conductive layer 50 in the above-described manner, the third composite substrate 3 is obtained.

(Step of Removing Temporary Supporting Substrate)

Referring to (F) and (G) of FIG. 2 and (G) and (H) of FIGS. 3 and 6, at the step of removing temporary supporting substrate 40, the method of removing temporary supporting substrate 40 from the third composite substrate 3 is not specifically limited. For instance, if temporary supporting substrate 40 is joined to the second group III nitride semiconductor layer 220 by wax 42, wax 42 may be melt, to remove temporary supporting substrate 40.

By removing temporary supporting substrate 40 from the third composite substrate 3 in the above-described manner, a semiconductor device 5 having supporting substrate 60, conductive layer 50 placed on supporting substrate 60, and the first and second group III nitride semiconductor layers 210 and 220 as at least one group III nitride semiconductor layer 200 placed on conductive layer 50, wherein the first group III nitride semiconductor layer 210 as the conductive-layer-neighboring group III nitride semiconductor layer 200c adjacent to conductive layer 50 among the group III nitride semiconductor layers 200 has n type conductivity, dislocation density of at most $1 \times 10^{17}$ cm$^{-2}$, and oxygen concentration of at most $5 \times 10^{18}$ cm$^{-3}$, is provided.

(Embodiment 3)

Figure 4:
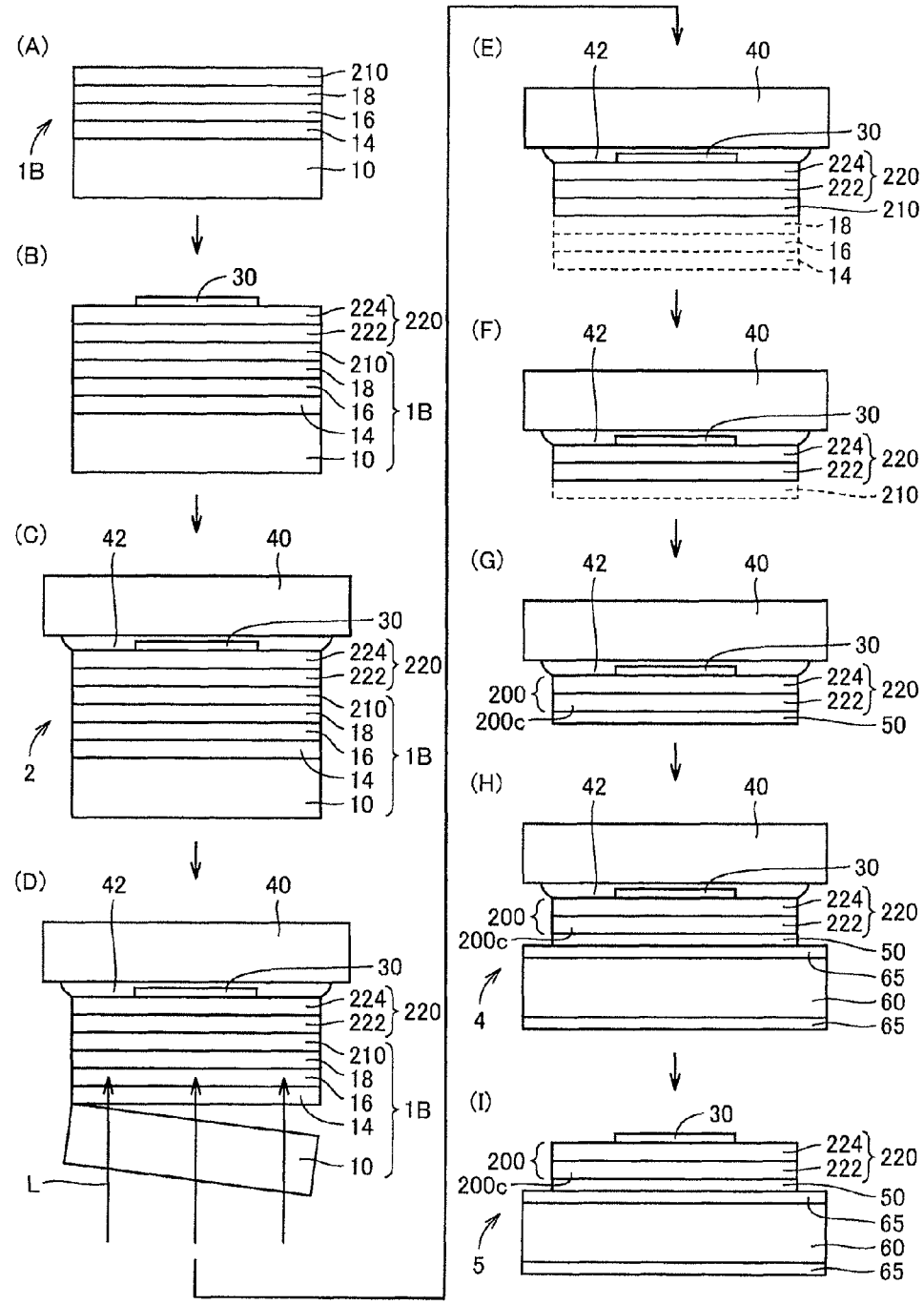
FIG. 4 is a schematic cross-sectional view showing a further example of a method of manufacturing the semiconductor device in accordance with the present invention.
Figure 5:
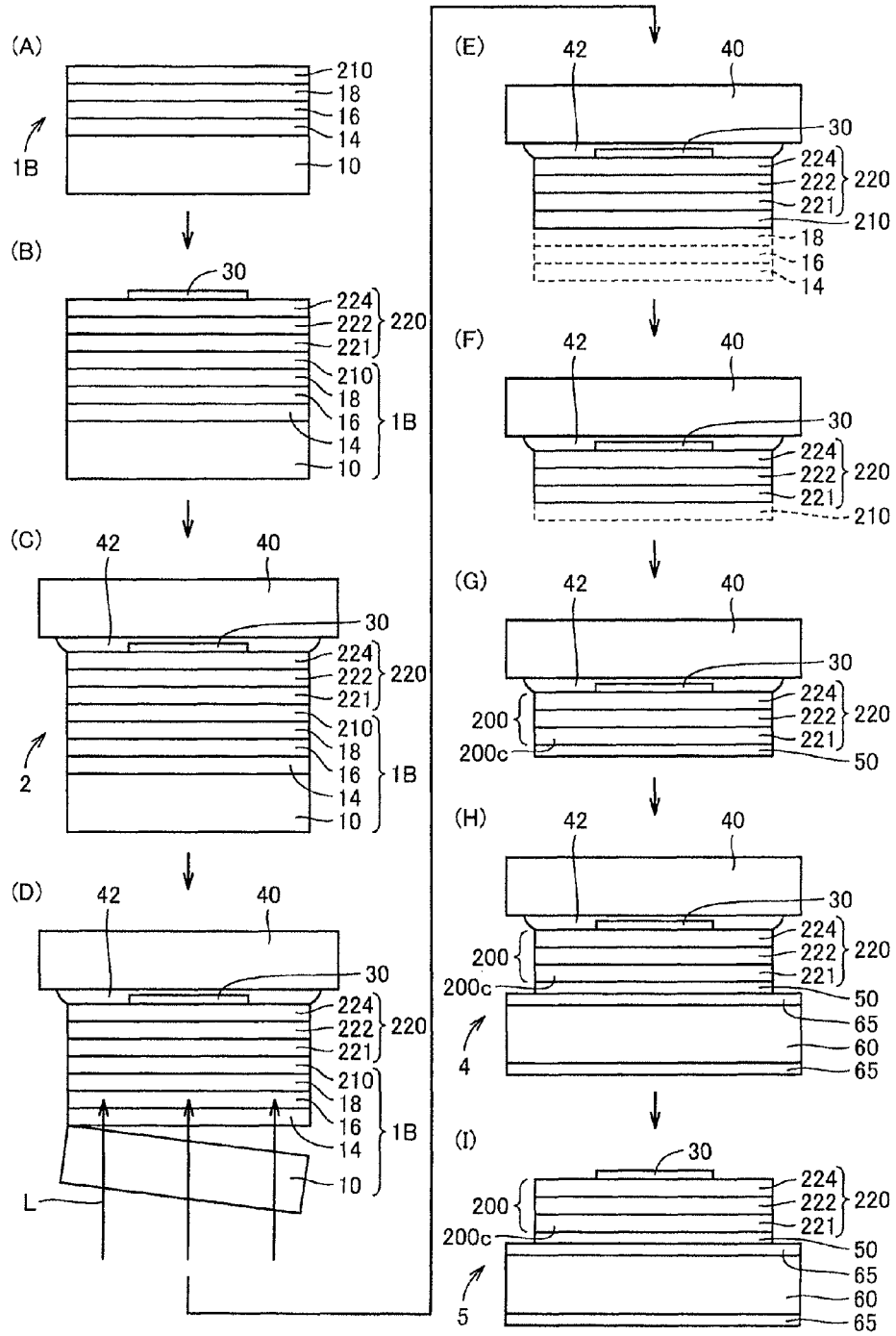
FIG. 5 is a schematic cross-sectional view showing a still further example of a method of manufacturing the semiconductor device in accordance with the present invention.

Referring to FIGS. 4 and 5, the method of manufacturing a semiconductor device in accordance with a still further embodiment of the present invention includes the steps of: preparing the first composite substrate 1B having the first group III nitride semiconductor layer 210 joined to underlying substrate 10 ((A) in FIGS. 4 and 5); growing at least one second group III nitride semiconductor layer 220 on the first group III nitride semiconductor layer 210 of the first composite substrate 1B ((B) in FIGS. 4 and 5); joining temporary supporting substrate 40 to the second group III nitride semiconductor layer 220 to form the second composite substrate 2 ((C) in FIGS. 4 and 5); removing underlying substrate 10 from the second composite substrate 2 ((D) in FIGS. 4 and 5); removing the first group III nitride semiconductor layer 210 ((F) in FIGS. 4 and 5); forming conductive layer 50 on the second group III nitride semiconductor layer 220 ((G) in FIGS. 4 and 5); joining supporting substrate 60 to conductive layer 50 to form a fourth composite substrate 4 ((H) in FIGS. 4 and 5); and removing temporary supporting substrate 40 from the fourth composite substrate 4 ((I) in FIGS. 4 and 5); wherein among the second group III nitride semiconductor layers 220, conductive-layer-neighboring group III nitride semiconductor layer 220c adjacent to conductive layer 50 has n type conductivity, dislocation density of at most $1 \times 10^{7}$ cm$^{-2}$, and oxygen concentration of at most $5 \times 10^{17}$ cm$^{-3}$.

(From the Step of Preparing the First Composite Substrate to the Step of Removing Underlying Substrate)

Referring to (A) to (E) of FIGS. 4 and 5, in the method of manufacturing semiconductor device 5 in accordance with a still further embodiment of the present invention, the step of preparing the first composite substrate 1B, the step of growing the second group III nitride semiconductor layer 220, the step of forming the second composite substrate 2 and the step of removing underlying substrate 10 are the same as the step of preparing the first composite substrate 1A, 1B, the step of growing the second group III nitride semiconductor substrate 220, the step of forming the second composite substrate 2 and the step of removing the underlying substrate 10 in the method of manufacturing semiconductor device 5 in accordance with Embodiment 2, respectively.

Though only the first composite substrate 1B is shown in FIGS. 4 and 5, in the method of manufacturing a semiconductor device in accordance with the present embodiment, the first composite substrate 1A may be used in place of the first composite substrate 1B, as in the method of manufacturing a semiconductor device in accordance with Embodiment 2.

(Step of Removing the First Group III Nitride Semiconductor Layer)

Referring to (F) of FIGS. 4 and 5, at the step of removing the first group III nitride semiconductor layer 210, the method of removing the first group III nitride semiconductor layer 210 is not specifically limited, and dry etching such as RIE may suitably be used.

By removing the first group III nitride semiconductor layer 210 in this manner, the second group III nitride semiconductor layer 220 is exposed and it becomes possible to form conductive layer 50 thereon. As the first group III nitride semiconductor layer 210 having damages caused by ion implantation is removed, better electrical bonding between the second group III nitride semiconductor layer 220 and conductive layer 50 can be attained.

(Step of Forming Conductive Layer)

Referring to (G) of FIGS. 4 and 5, at the step of forming conductive layer 50, the method of forming conductive layer 50 on the second group III nitride semiconductor layer 220 is not specifically limited as long as it is suitable for forming conductive layer 50, and sputtering, vacuum deposition or the like may suitably be used.

Here, conductive layer 50 is not specifically limited. From the viewpoint of lowering contact resistance, a metal layer such as an Al layer, a W layer or a Hf layer is preferred, and if light permeability is desired, a conductive oxide layer such as an ITO (Indium Tin Oxide) layer or a ZnO (Zinc Oxide) layer is preferred. Further, in order to improve adhesiveness and/or to form a pad electrode, a metal layer such as Ti and/or Au may be included. By way of example, an Al/Ti/Au layer having these metal layers stacked is suitably used.

(Step of Forming the Fourth Composite Substrate)

Referring to (H) of FIGS. 4 and 5, at the step of forming the fourth composite substrate 4, the method of joining supporting substrate 60 to conductive layer 50 is not specifically limited, provided that reliable joining to conductive layer 50 is ensured and conductive layer 50 and the second group III nitride semiconductor layer 220 are satisfactorily supported. By way of example, solder bonding of bonding joining surfaces with solder, direct bonding method of cleaning the surfaces to be joined, directly joining the surfaces and then heating to 700° C. to 1000° C. for bonding, or a surface activation method of activating the joining surfaces by plasma or ions to attain bonding may preferably be used.

Further, supporting substrate 60 is not specifically limited, provided that it can reliably be bended to conductive layer 50 and satisfactorily support conductive layer 50 and the second group III nitride semiconductor layer 220. From the viewpoint of high light permeability and high light extraction efficiency, a supporting substrate formed of sapphire or a supporting substrate formed of spinel is preferred. From the viewpoint of conductivity required of a vertical semiconductor device, a supporting substrate of Si or a supporting substrate of group III nitride is preferred. From the viewpoint of attaining the same or similar thermal expansion coefficient as the second group III nitride semiconductor layer 220, a supporting substrate of group III nitride, or a supporting substrate of SiC is preferred. Supporting substrate 60 may be a single crystal or polycrystalline substrate.

From the viewpoint of enhancing bonding characteristic to conductive layer 50, supporting substrate 60 preferably has a surface conductive layer 65 formed on its surface. Though surface conductive layer 65 of supporting substrate 60 is not specifically limited, preferably, it has the same or similar chemical composition as conductive layer 50. For a vertical semiconductor device, it is preferred that supporting substrate 60 and surface conductive layer 65 form ohmic contact. By way of example, if conductive layer 50 is an Al/Ti/Au layer and supporting substrate 60 is an Si supporting substrate, surface conductive layer 65 should preferably be an alloy layer of Al/Ti/Au.

By joining supporting substrate 60 to conductive layer 50 in the above-described manner, the fourth composite substrate 4 is obtained.

(Step of Removing Temporary Supporting Substrate)

Referring to (H) and (I) of FIGS. 4 and 5, at the step of removing temporary supporting substrate 40, the method of removing temporary supporting substrate 40 from the fourth composite substrate 4 is not specifically limited. For instance, if temporary supporting substrate 40 is joined to the second group III nitride semiconductor layer 220 by wax 42, wax 42 may be melt, to remove temporary supporting substrate 40.

By removing temporary supporting substrate 40 from the fourth composite substrate 4 in the above-described manner, a semiconductor device 5 having supporting substrate 60, conductive layer 50 placed on supporting substrate 60, and the second group III nitride semiconductor layer 220 as at least one group III nitride semiconductor layer 200 placed on conductive layer 50, wherein the conductive-layer-neighboring group III nitride semiconductor layer 200c adjacent to conductive layer 50 among the second group III nitride semiconductor layers 220 as the group III nitride semiconductor layer 200 has n type conductivity, dislocation density of at most $1\times10^7$ cm$^{-2}$, and oxygen concentration of at most $5\times10^{17}$ cm$^{-3}$, is provided. Here, the second group III nitride semiconductor layer 220 is epitaxially grown on the first group III nitride semiconductor layer 210 and, hence, oxygen concentration can further be reduced as compared with the first group III nitride semiconductor layer 210.Therefore, the oxygen concentration of conductive-layer-neighboring group III nitride semiconductor layer 200c can be reduced to at most $5\times10^{17}$ cm$^{-3}$.

EXAMPLES

Example 1

1. Preparation of First Composite Substrate

Referring to (A) of FIG. 2, the first composite substrate 1A was prepared by joining a sapphire underlying substrate (underlying substrate 10) of 2 inches (5.08 cm) in diameter and 400 μm in thickness to a GaN layer (first group III nitride semiconductor layer 210) of 150 nm in thickness, with an SiO$_2$ layer 12 of 200 nm in thickness interposed. Here, the GaN layer (first group III nitride semiconductor layer 210) had dislocation density of $5\times10^6$ cm$^{-2}$ and oxygen concentration of $2\times10^{18}$ cm$^{-3}$. The dislocation density was measured by CL (Cathode Luminescence) and the oxygen concentration was measured by SIMS (Secondary Ion Mass Spectroscopy).

Specifically, the first composite substrate 1A as such was prepared in the following manner. First, referring to FIG. 7(A), on a sapphire underlying substrate (underlying substrate 10) of 2 inches (5.08 cm) in diameter and 40 μm in thickness, SiO$_2$ layer 12a was formed to the thickness of 100 nm by plasma CVD. Further, on one main surface of a GaN substrate (group III nitride semiconductor substrate 20) having dislocation density of $5\times10^6$ cm$^{-2}$ and oxygen concentration of $2\times10^{18}$ cm$^{-3}$, SiO$_2$ layer 12b was formed to the thickness of 100 nm by plasma CVD, and hydrogen ions were implanted to a plane P at the depth of about 150 nm from the main surface. Next, referring to FIG. 7(B), surfaces of SiO$_2$ layer 12a formed on the sapphire underlying substrate (underlying substrate 10) and SiO$_2$ layer 12b formed on the GaN substrate (group III nitride semiconductor substrate 20) were cleaned by oxygen plasma treatment using a dry etching apparatus, and put together and pressed with the load of 7 MPa at room temperature (25° C.) to be joined. The joined substrate obtained in this manner was slowly heated from room temperature (25° C.) to 300° C. in three hours, to increase bonding strength at the bonded interface. By this bonding, the two SiO$_2$ layers 12a and 12b were integrated to form an SiO$_2$ layer 12 having the thickness of 200 nm.

Thereafter, referring to FIG. 7(C), the joined substrate described above was heated to 500° C., and diagonal stress was applied to the main surface of the substrate. As the GaN substrate (group III nitride semiconductor substrate 20) was separated at the plane P, the first composite substrate 1A having a GaN layer (the first group III nitride semiconductor layer 210) of 150 nm in thickness joined to the sapphire underlying substrate (underlying substrate 10) with SiO$_2$ layer 12 interposed was obtained.

2. Growth of the Second Group III Nitride Semiconductor Layer

Referring to FIG. 2(B), the first composite substrate 1A was subjected to thermal cleaning in a mixed gas of ammonia (NH$_3$) gas and hydrogen (H$_2$) gas at 1050° C. for 10 minutes. On the GaN layer (first group III nitride semiconductor layer 210) of the first composite substrate 1A as such, as the second group III nitride semiconductor layer 220, an n$^+$ GaN layer 222 having the thickness of 1 μm and Si concentration of $2\times10^{18}$ cm$^{-3}$ and n$^-$ GaN layer (drift layer) 224 having the thickness of 5 μm and Si concentration of $6\times10^{15}$ cm$^{-3}$ were successively grown at 1100° C. by MOVPE method. Further, on n GaN layer 224, an Ni layer (50 nm in thickness)/Au layer (500 nm in thickness) of 200 μm in diameter were formed by vacuum deposition and annealed for two minutes at 600° C. to form an alloy, whereby a Schottky electrode (electrode 30) was formed.

3. Formation of the Second Composite Substrate by Joining Temporary Supporting Substrate Referring to FIG. 2(C), the second group III nitride semiconductor layer 220 and electrode 30 described above were joined to a sapphire temporary supporting substrate (temporary supporting substrate 40) by wax 42, whereby the second composite substrate 2 was obtained.

4. Removal of Underlying Substrate

Referring to (C) and (D) of FIG. 2, THG-YAG laser beam L having the wavelength of 355 nm was directed to the side of sapphire underlying substrate (underlying substrate 10) of the second composite substrate 2, so that the laser beam was absorbed by the GaN layer (first group III nitride semiconductor layer 210) and a portion of the GaN layer (first group III nitride semiconductor layer 210) near the interface with the sapphire underlying substrate (underlying substrate 10) was decomposed, whereby the sapphire underlying substrate (underlying substrate 10) was lift-off.

The surface of GaN layer (first group III nitride semiconductor layer 210) exposed by the lift-off had RMS (Root Mean Square) roughness (corresponding to Rq defined in JIS B0601-2001; the same in the following), measured by an AFM (Atomic Force Microscope) for a range of 100 μm×100 μm, was as small as 200 nm. Possible reason for this is that the GaN layer (first group III nitride semiconductor layer 210) had high crystallinity and, therefore, decomposition that took place near the interface with the sapphire underlying substrate (underlying substrate 10) was uniform, resulting in high surface flatness.

5. Formation of Conductive Layer

Referring to FIG. 2(E), on the exposed main surface of GaN layer (first group III nitride semiconductor layer 210), an ohmic electrode (conductive layer 50) of Al layer (20 nm in thickness)/Ti layer (50 nm in thickness)/Au layer (500 nm in thickness) was formed by vacuum deposition.

6. Formation of the Third Composite Substrate by Joining Supporting Substrate

Referring to (F) of FIG. 2, on both main surfaces of Si supporting substrate (supporting substrate 60), Al layer (20 nm in thickness)/Ti layer (50 nm in thickness)/Au layer (500 nm in thickness) were formed by vacuum deposition and annealed for 10 minutes at 400° C., whereby a substrate having surface conductive layers 65 was prepared. Surface conductive layer 65 was joined to the ohmic electrode (conductive layer 50) by AuSn solder, whereby the third composite substrate 3 was formed.

7. Removal of Temporary Supporting Substrate

Referring to (F) and (G) of FIG. 2, by melting wax 42 of the third composite substrate 3, the sapphire temporary supporting substrate (temporary supporting substrate 40) was removed from the third composite substrate 3, and as semiconductor device 5, an SBD (Schottky Barrier Diode) having, on the Si supporting substrate (supporting substrate 60) having the alloy layer (surface conductive layer 65) of Al layer (20 nm in thickness)/Ti layer (50 nm in thickness)/Au layer (500 nm in thickness) formed on both main surfaces, the ohmic electrode (conductive layer 50) formed of Al layer (20 nm in thickness)/Ti layer (50 nm in thickness)/Au layer (500 nm in thickness), the GaN layer (first group III nitride semiconductor layer 210), the n$^+$ GaN layer 222 and n$^-$ GaN layer (drift layer) 224 (second group III nitride semiconductor layer 220) and the Schottky electrode (electrode 30) formed of an alloy of Ni layer (50 nm in thickness)/Au layer (500 nm in thickness) formed in this order was obtained.

I-V (current-voltage) characteristics of the thus obtained SBD (semiconductor device 5) were evaluated by a parameter analyzer, and satisfactory results of on-resistance of 1.4 mΩcm$^2$ and reverse breakdown voltage of 400V at current density of 1×10$^{-3}$ A/cm$^2$ were observed.

Comparative Example 1

1. Growth of Group III Nitride Semiconductor Layer

Figure 9:
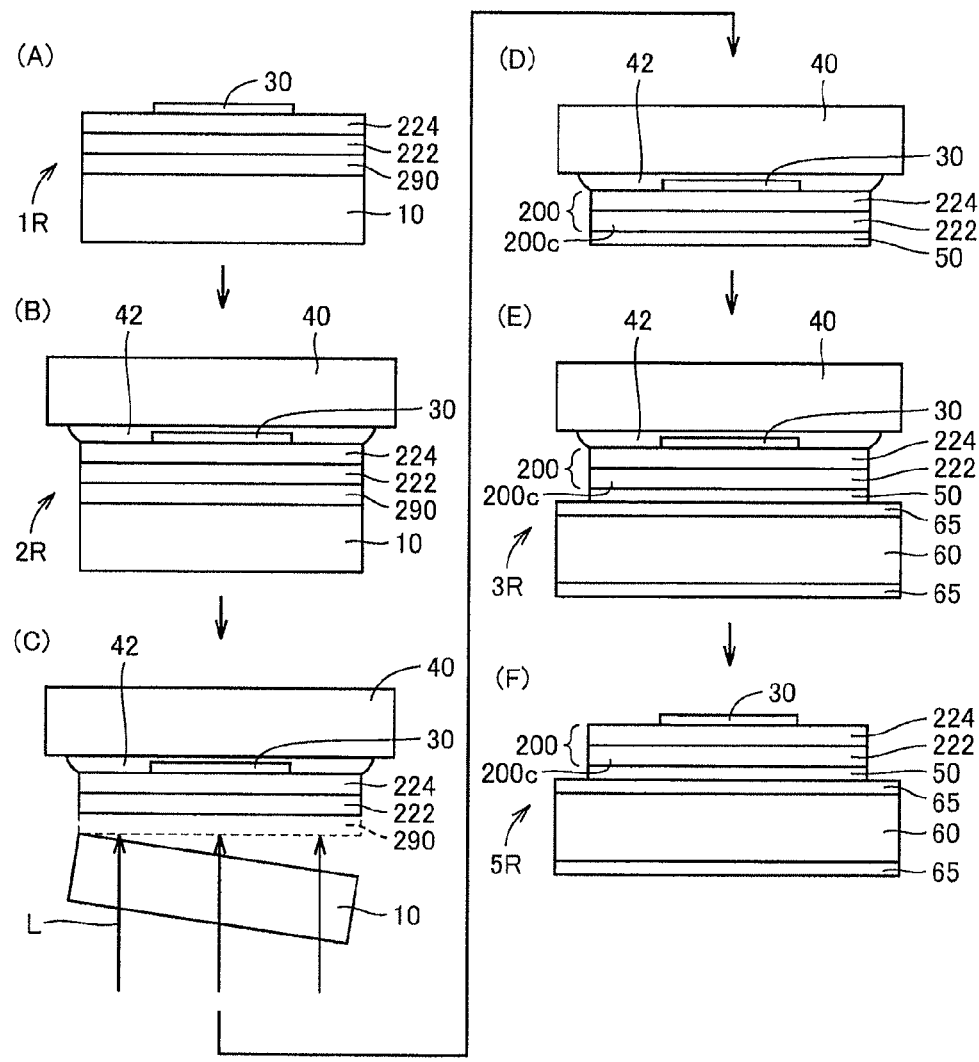
FIG. 9 is a schematic cross-sectional view showing an example of a method of manufacturing a typical semiconductor device.

Referring to (A) of FIG. 9, a sapphire underlying substrate having the diameter of 2 inches (5.08 cm) and thickness of 400 μm was subjected to thermal cleaning in a hydrogen (H$_2$) gas atmosphere at 1100° C. for 10 minutes. Thereafter, by MOVPE, on the sapphire underlying substrate (underlying substrate 10), a GaN buffer layer (group III nitride buffer layer 290) was grown to the thickness of 25 nm at 525° C., and on the GaN buffer layer (group III nitride buffer layer 290), n$^+$ GaN layer 222 having the thickness of 1 μm and Si concentration of 2×10$^{18}$ cm$^{-3}$ and n$^-$ GaN layer (drift layer) 224 having the thickness of 5 μm and Si concentration of 6×10$^{15}$ cm$^{-3}$ were successively formed at 1100° C. By the similar measurement as in Example 1, it was found that n$^+$ GaN layer 222 had the dislocation density of 1×10$^9$ cm$^{-2}$ and oxygen concentration at a portion near the interface with the sapphire underlying substrate (underlying substrate 10) of 1×10$^{19}$ cm$^{-3}$.

Further, as in Example 1, on n$^-$ GaN layer 224, a Schottky electrode (electrode 30) was formed, and thus, a composite substrate 1R was obtained.

2. Joining of Temporary Supporting Substrate

Referring to FIG. 9(B), the n$^-$ GaN layer 224 and Schottky electrode (electrode 30) of composite substrate 1R were joined to a sapphire temporary supporting substrate (temporary supporting substrate 40) by wax 42 as in Example 1, and thus, a composite substrate 2R was obtained.

3. Removal of Underlying Substrate

Referring to (B) and (C) of FIG. 9, as in Example 1, THG-YAG laser beam L having the wavelength of 355 nm was directed to the side of sapphire underlying substrate (underlying substrate 10) of the composite substrate 2R, so that the laser beam was absorbed by the GaN buffer layer (group III nitride buffer layer 290) and thus the layer was decomposed, whereby the sapphire underlying substrate (underlying substrate 10) was lift-off.

The RMS roughness of the surface of n$^+$ GaN layer 222 exposed by the lift-off was measured in the same manner as in Example 1, and it was as large as 650 nm. The possible reason for this is that GaN buffer layer (group III nitride buffer layer 290) and n$^+$ GaN layer 222 had low crystallinity and at a portion near the interface with the sapphire underlying substrate (underlying substrate 10), oxygen concentration was high. Thus, at the portion near the interface with the sapphire underlying substrate (underlying substrate 10), decomposition was not uniform, and the surface flatness became lower.

4. Formation of Conductive Film

Referring to FIG. 9(D), on the exposed surface of n$^+$ GaN layer 222, an ohmic electrode (conductive layer 50) was formed in the similar manner as in Example 1.

5. Joining of Supporting Substrate

Referring to FIG. 9(E), as in Example 1, the ohmic electrode (conductive layer 50) was joined to an Si supporting substrate (supporting substrate 60) having an alloy layer (surface conductive layer 65) of Al layer (20 nm in thickness)/Ti layer (50 nm in thickness)/Au layer (500 nm in thickness) formed on both main surfaces, whereby a composite substrate 3R was obtained.

6. Removal of Temporary Supporting Substrate

Referring to (E) and (F) of FIG. 9, as in Example 1, the sapphire temporary supporting substrate (temporary supporting substrate 40) was removed from composite substrate 3R, and as semiconductor device 5R, an SBD (Schottky Barrier Diode) having, on the Si supporting substrate (supporting substrate 60) having the alloy layer (surface conductive layer 65) of Al layer (20 nm in thickness)/Ti layer (50 nm in thickness)/Au layer (500 nm in thickness) formed on both main surfaces, the ohmic electrode (conductive layer 50) formed of Al layer (20 nm in thickness)/Ti layer (50 nm in thickness)/Au layer (500 nm in thickness), $n^+$ GaN layer 222 and GaN layer (drift layer) 224 (corresponding to group III nitride semiconductor layer 200) and the Schottky electrode (electrode 30) formed of an alloy of Ni layer (50 nm in thickness)/Au layer (500 nm in thickness) formed in this order was obtained.

I-V characteristics of the thus obtained SBD (semiconductor device 5R) were evaluated in the similar manner as in Example 1, and the results show low characteristics of on-resistance of 2.6 mΩcm$^2$ and reverse breakdown voltage of 80V at current density of $1\times10^{-3}$ A/cm$^2$. The possible reason why the on-resistance was high is decrease in contact characteristic, resulting from the fact that the surface flatness of $n^+$ GaN layer 222 exposed after the lift-off of sapphire underlying substrate (underlying substrate 10) was low and hence bonding characteristic between the ohmic electrode (conductive layer 50) and the alloy layer (surface conductive layer 65) of Al layer (20 nm in thickness)/Ti layer (50 nm in thickness)/Au layer (500 nm in thickness) formed on the Si supporting substrate (supporting substrate 60) was degraded, and that $n^+$ GaN layer 222 having low crystallinity was much damaged at the time of lift-off. The possible reason why the reverse breakdown voltage lowered is that $n^+$ GaN layer 222 had high dislocation density.

Example 2

1. Preparation of First Composite Substrate

Referring to FIG. 3(A), the first composite substrate 1B was prepared by joining a GaN underlying substrate (underlying substrate 10) of 2 inches (5.08 cm) in diameter and 400 μm in thickness to a GaN layer (first group III nitride semiconductor layer 210) of 150 nm in thickness, with a first SiO$_2$ layer 14 of 10 nm in thickness, an amorphous Si layer 16 of 60 nm in thickness and a second SiO$_2$ layer 18 of 230 nm in thickness interposed. Here, the GaN layer (first group III nitride semiconductor layer 210) had dislocation density of $5\times10^6$ cm$^{-2}$ and oxygen concentration of $2\times10^{18}$ cm$^{-3}$.

Specifically, the first composite substrate 1B was prepared in the following manner. First, referring to FIG. 8(A), on a GaN underlying substrate (underlying substrate 10) of 2 inches (5.08 cm) in diameter and 40 μm in thickness, the first SiO$_2$ layer 14 of 10 nm in thickness, amorphous Si layer 16 of 60 nm in thickness, and the second SiO$_2$ layer 18a of 130 nm in thickness were successively formed by plasma CVD. Further, on one main surface of GaN substrate (group III nitride semiconductor substrate 20) having dislocation density of $5\times10^6$ cm$^{-2}$ and oxygen concentration of $2\times10^{18}$ cm$^{-3}$, the second SiO$_2$ layer 18b of 100 nm in thickness was formed by plasma CVD, and hydrogen ions were implanted to a plane P at a depth of about 150 nm from the main surface.

Next, referring to FIG. 8(B), surfaces of the second SiO$_2$ layer 18a formed on the GaN underlying substrate (underlying substrate 10) and the second SiO$_2$ layer 18b formed on the GaN substrate (group III nitride semiconductor substrate 20) were cleaned by oxygen plasma treatment using a dry etching apparatus, and put together and pressed with the load of 7 MPa at room temperature (25° C.) to be joined. The joined substrate obtained in this manner was slowly heated from room temperature (25° C.) to 300° C. in three hours, to increase bonding strength at the bonded interface. By this bonding, the two SiO$_2$ layers 18a and 18b were integrated to form the second SiO$_2$ layer 18 having the thickness of 230 nm.

Then, referring to FIG. 8(C), the joined substrate described above was heated to 500° C., and diagonal stress was applied to the main surface of the substrate. As the GaN substrate (group III nitride semiconductor substrate 20) was separated at the plane P, the first composite substrate 1B having a GaN layer (the first group III nitride semiconductor layer 210) of 150 nm in thickness joined to the GaN underlying substrate (underlying substrate 10) with the first SiO$_2$ layer 14, amorphous layer 16 and the second SiO$_2$ layer 18 interposed was obtained.

2. Growth of the Second Group III Nitride Semiconductor Layer

Referring to FIG. 3(B), as in Example 1, the first composite substrate 1B was subjected to thermal cleaning and, on the GaN layer (first group III nitride semiconductor layer 210) of the first composite substrate 1B, as the second group III nitride semiconductor layer 220, an $n^+$ GaN layer 222 having the thickness of 1 μm and Si concentration of $2\times10^{18}$ cm$^{-3}$ and $n^-$ GaN layer (drift layer) 224 having the thickness of 5 μm and Si concentration of $6\times10^{15}$ cm$^{-3}$ were successively grown at 1100° C. by MOVPE method. Further, as in Example 1, on $n^-$ GaN layer 224, a Schottky electrode (electrode 30) was fanned.

3. Formation of the Second Composite Substrate by Joining Temporary Supporting Substrate Referring to FIG. 3(C), as in Example 1, the second group III nitride semiconductor layer 220 and electrode 30 described above were joined to a sapphire temporary supporting substrate (temporary supporting substrate 40) by wax 42, whereby the second composite substrate 2 was obtained.

4. Removal of Underlying Substrate

Referring to (C) and (D) of FIG. 3, SHG-YAG laser beam L having the wavelength of 532 nm was directed to the side of GaN underlying substrate (underlying substrate 10) of the second composite substrate 2, so that the laser beam L was absorbed by amorphous Si layer 16 and converted to heat, and by the heat, the portion of GaN underlying substrate (underlying substrate 10) near the interface with the first SiO$_2$ layer 14 was decomposed, whereby the GaN underlying substrate (underlying substrate 10) was lift-off. Here, since the second SiO$_2$ layer 18 is sufficiently thicker than the first SiO$_2$ layer 14, it is possible to selectively decompose the GaN underlying substrate (underlying substrate 10) and not the GaN layer (first group III nitride semiconductor layer 210).

Referring to FIG. 3(E), the first SiO$_2$ layer 14, amorphous Si layer 16 and the second SiO$_2$ layer 18 left on the GaN layer (first group III nitride semiconductor layer 210) were removed by wet etching using a mixed solution of hydrofluoric acid and nitric acid.

The RMS roughness of the surface of GaN layer (first group III nitride semiconductor layer 210) exposed by the lift-off was measured in the same manner as in Example 1, and it was as small as 40 nm. The reason for this may be that the GaN layer (first group III nitride semiconductor layer 210) had high crystallinity and that its surface was exposed by etching and not by decomposition at the time of lift-off and hence the surface came to have high flatness.

5. Formation of Conductive Layer

Referring to FIG. 3(F), on the exposed main surface of GaN layer (first group III nitride semiconductor layer 210), an ohmic electrode (conductive layer 50) was formed in the similar manner as in Example 1.

6. Formation of the Third Composite Substrate by Joining Supporting Substrate Referring to FIG. 3(G), as in Example 1, to the ohmic electrode (conductive layer 50), the Si supporting substrate (supporting substrate 60) having an alloy layer (surface conductive layer 65) of Al layer (20 nm in thickness)/Ti layer (50 nm in thickness)/Au layer (500 nm in thickness) on both main surfaces was joined, and thus, a third composite substrate 3 was formed.

7. Removal of Temporary Supporting Substrate

Referring to (G) and (H) of FIG. 3, as in Example 1, the sapphire temporary supporting substrate (temporary supporting substrate 40) was removed from the third composite substrate 3, and as semiconductor device 5, an SBD (Schottky Barrier Diode) having, on the Si supporting substrate (supporting substrate 60) having the alloy layer (surface conductive layer 65) of Al layer (20 nm in thickness)/Ti layer (50 nm in thickness)/Au layer (500 nm in thickness) formed on both main surfaces, the ohmic electrode (conductive layer 50) formed of Al layer (20 nm in thickness)/Ti layer (50 nm in thickness)/Au layer (500 nm in thickness), the GaN layer (first group III nitride semiconductor layer 210), the n$^+$ GaN layer 222 and n GaN layer (drift layer) 224 (second group III nitride semiconductor layer 220) and the Schottky electrode (electrode 30) formed of an alloy of Ni layer (50 nm in thickness)/Au layer (500 nm in thickness) formed in this order was obtained.

I-V characteristics of the thus obtained SBD (semiconductor device 5) were evaluated in the similar manner as in Example 1, and the results show high characteristics of on-resistance of 1.2 mΩcm$^2$ and reverse breakdown voltage of 400V at current density of $1\times10^{-3}$ A/cm$^2$. Particularly in the present embodiment, not the GaN layer (first group III nitride semiconductor layer 210) but the GaN underlying substrate (underlying substrate 10) was partially decomposed to lift-off the GaN underlying substrate (underlying substrate 10), so that the damage to the GaN layer (first group III nitride semiconductor layer 210) was further reduced and the bonding characteristics between the GaN layer (first group III nitride semiconductor layer 210) and conductive layer 50 was further improved, and this is considered to be the reason why the on-resistance could be made lower than in the SBD of Example 1.

Example 3

1. From Preparation of First Composite Substrate to Removal of Underlying Layer Referring to (A) to (E) of FIG. 4, as in Example 2, the first composite substrate 1B was prepared, the second group III nitride semiconductor layer 220 was grown, temporary underlying layer 40 was joined to form the second composite substrate 2, underlying substrate 10 was removed from the thus formed second composite substrate 2, and then, the first SiO$_2$ layer 14, amorphous Si layer 16 and the second SiO$_2$ layer 18 left on the GaN layer (first group III nitride semiconductor layer 210) were removed by wet etching using a mixed solution of hydrofluoric acid and nitric acid (FIG. 4(E)).

2. Removal of the First Group III Nitride Semiconductor Layer

Referring to FIG. 4(F), the GaN layer (first group III nitride semiconductor layer 210) was removed by RIB. The n$^+$ GaN layer 222 exposed by the RIE had extremely high crystallinity as represented by dislocation density of $5\times10^6$ cm$^{-2}$ and oxygen concentration of $5\times10^{16}$ cm$^{-3}$ and was flat as represented by the RMS roughness of its surface of 40 nm.

3. Formation of Conductive Layer

Referring to FIG. 4(G), on the main surface of exposed n$^+$ GaN layer 222, an ohmic electrode (conductive layer 50) was formed in the similar manner as Example 1.

4. Formation of the Fourth Composite Substrate by Joining Supporting Substrate Referring to FIG. 4(H), as in Example 1, an Si supporting substrate (supporting substrate 60) having an alloy layer (surface conductive layer 65) of Al layer (20 nm in thickness)/Ti layer (50 nm in thickness)/Au layer (500 nm in thickness) formed on both main surfaces was joined to the ohmic electrode (conductive layer 50), and thereby the fourth composite substrate 4 was formed.

5. Removal of Temporary Supporting Substrate

Referring to (H) and (I) of FIG. 4, as in Example 1, the sapphire temporary supporting substrate (temporary supporting substrate 40) was removed from the fourth composite substrate 4, and as semiconductor device 5, an SBD (Schottky Barrier Diode) having, on the Si supporting substrate (supporting substrate 60) having the alloy layer (surface conductive layer 65) of Al layer (20 nm in thickness)/Ti layer (50 nm in thickness)/Au layer (500 nm in thickness) formed on both main surfaces, the ohmic electrode (conductive layer 50) formed of Al layer (20 nm in thickness)/Ti layer (50 nm in thickness)/Au layer (500 nm in thickness), the n$^+$ GaN layer 222 and n$^-$ GaN layer (drift layer) 224 (second group III nitride semiconductor layer 220) and the Schottky electrode (electrode 30) formed of an alloy of Ni layer (50 nm in thickness)/Au layer (500 nm in thickness) formed in this order was obtained.

I-V characteristics of the thus obtained SBD (semiconductor device 5) were evaluated in the similar manner as in Example 1, and the results show high characteristics of on-resistance of 1.1 mΩcm$^2$ and reverse breakdown voltage of 400V at current density of $1\times10^{-3}$ A/cm$^2$. Particularly in the present embodiment, the GaN layer (first group III nitride semiconductor layer 210) damaged by hydrogen ion implantation was removed and n$^+$ GaN layer 222 having higher crystallinity was bonded to conductive layer 50, whereby the contact characteristics between the semiconductor layer and conductive layer was further improved, and this is considered to be the reason why the on-resistance could be made lower than in the SBD of Example 2.

Example 4

1. Preparation of the First Composite Substrate

Referring to FIG. 5(A), the first composite substrate 1B was formed in the similar manner as Example 2.

2. Growth of the Second Group III Nitride Semiconductor Layer

Referring to FIG. 5(B), as in Example 1, the first composite substrate 1B described above was subjected to thermal cleaning, and on the GaN layer (first group III nitride semiconductor layer 210) of the first composite substrate 1B as such, as the second group III nitride semiconductor layer 220, an n$^+$ Al$_{0.04}$Ga$_{0.96}$N layer 221 having the thickness of 20 nm and Si concentration of $2\times10^{18}$ cm$^{-3}$, an n$^+$ GaN layer 222 having the thickness of 1 μm and Si concentration of $2\times10^{18}$ cm$^{-3}$, and an n$^-$ GaN layer (drift layer) 224 having the thickness of 5 μm and Si concentration of $6\times10^{15}$ cm$^{-3}$ were grown successively. Here, the n$^+$ Al$_{0.04}$Ga$_{0.96}$N layer 221 had dislocation density of $5\times10^6$ cm$^{-2}$ and oxygen concentration of $8\times10^{16}$ cm$^{-3}$. Further, as in Example 1, on n GaN layer 224, a Schottky electrode (electrode 30) was formed.

3. From Formation of the Second Composite Substrate to Removal of the Temporary Supporting Layer Referring to (C) to (I) of FIG. 5, as in Example 3, temporary supporting substrate 40 was joined to form the second composite substrate 2, underlying substrate 10 was removed from the second composite substrate 2 as such, the first SiO$_2$ layer 14, amorphous Si layer 16, the second SiO$_2$ layer 18 and the GaN layer (first group III nitride semiconductor layer 210) were removed, an ohmic electrode (conductive electrode 50) was formed on the exposed surface of n$^+$ Al$_{0.04}$Ga$_{0.96}$N layer 221, the ohmic electrode (conductive layer 50) was joined to an Si supporting substrate (supporting substrate 60) having an alloy layer (surface conductive layer 65) of Al layer (20 nm in thickness)/Ti layer (50 nm in thickness)/Au layer (500 nm in thickness) formed on both main surfaces to form the fourth composite substrate 4, and the sapphire temporary supporting substrate (temporary supporting substrate 40) was removed from the fourth composite substrate 4 as such, whereby the SBD as semiconductor device 5 was obtained.

The resulting SBD (semiconductor device 5) had, on the Si supporting substrate (supporting substrate 60) having the alloy layer (surface conductive layer 65) of Al layer (20 nm in thickness)/Ti layer (50 nm in thickness)/Au layer (500 nm in thickness) formed on both main surfaces, the ohmic electrode (conductive layer 50) formed of Al layer (20 nm in thickness)/Ti layer (50 nm in thickness)/Au layer (500 nm in thickness), n$^+$ Al$_{0.04}$Ga$_{0.96}$N layer 221, n$^+$ GaN layer 222 and n$^-$ GaN layer (drift layer) 224 (second group III nitride semiconductor layer 220) and the Schottky electrode (electrode 30) formed of an alloy of Ni layer (50 nm in thickness)/Au layer (500 nm in thickness), formed in this order.

I-V characteristics of the thus obtained SBD (semiconductor device 5) were evaluated in the similar manner as in Example 1, and the results show high characteristics of on-resistance of 1.1 mΩcm$^2$ and reverse breakdown voltage of 400V at current density of 1×10$^{-3}$ A/cm$^2$, comparable to the SBD of Example 3. It is noted that the SBD of the present example has a structure including the n$^+$ Al$_{0.04}$Ga$_{0.96}$N layer 221 interposed between the n$^+$ GaN layer 222 and the ohmic electrode (electrode 50) of Example 3. Because of the presence of Al$_x$Ga$_{1-x}$N layer (0<x≤1) having higher chemical bonding characteristic than the GaN layer, during etching of the GaN layer (first group III nitride semiconductor layer 210) for manufacturing the SBD, propagation of damages to n$^+$ Al$_{0.04}$G$_{0.96}$N layer 221, n$^+$ GaN layer 222 and n$^-$ GaN layer (drift layer) 224 (second group III nitride semiconductor layer 220) could be reduced, which is supposed to be the reason why the high characteristics could be attained.

Example 5

I. Preparation of the First Composite Substrate

Referring to FIG. 6(A), as in Example 2, the first composite substrate 1B was prepared.

2. Growth of the Second Group III Nitride Semiconductor Layer

Referring to FIG. 6(B), as in Example 1, the first composite substrate 1B described above was subjected to thermal cleaning, and on the GaN layer (first group III nitride semiconductor layer 210) of the first composite substrate 1B as such, as the second group III nitride semiconductor layer 220, an n type GaN layer 225 having the thickness of 2 μm, an n type In$_{0.02}$Ga$_{0.98}$N buffer layer 226 having the thickness of 100 nm, a light emitting layer 227 having a three-period multiple quantum well (MQW) structure formed of an In$_{0.15}$Ga$_{0.85}$N well layer of 3 nm in thickness and a GaN barrier layer of 15 nm in thickness, a p type Al$_{0.18}$Ga$_{0.82}$N electron block layer 228 of 20 nm in thickness and a p type GaN contact layer 229 of 50 nm in thickness were formed by MOVPE. Here, n type In$_{0.02}$Ga$_{0.98}$N buffer layer 226 and the GaN barrier layer were grown at 840° C., the In$_{0.15}$Ga$_{0.85}$N well layer was grown at 780° C., and other layers were grown at 1100° C.

Further, on a part of p type GaN contact layer 229. a p electrode (electrode 30) formed of Ni layer (5 nm in thickness)/Au layer (10 nm in thickness) and having a square outer shape of 0.8 mm×0.8 mm with an opening of 100 μm in diameter formed at the center was formed by vacuum deposition. A pad electrode 33 of Ti layer (50 nm in thickness)/Au layer (500 nm in thickness) having the diameter of 120 μm was formed by vacuum deposition to cover the opening of p electrode (electrode 30) and to be in contact with the p type GaN contact layer 229 and the p electrode (electrode 30).

3. From Foundation of the Second Composite Substrate to Removal of the Temporary Supporting Substrate Referring to (C) to (I) of FIG. 6, as in Example 2, temporary supporting substrate 40 was joined to form the second composite substrate 2, underlying substrate 10 was removed from the second composite substrate 2 as such, the first SiO$_2$ layer 14, amorphous Si layer 16 and the second SiO$_2$ layer 18 were removed, an ohmic electrode (conductive layer 50) was formed on the exposed surface of GaN layer (first group III nitride semiconductor layer 210), the ohmic electrode (conductive layer 50) was joined to an Si supporting substrate (supporting substrate 60) having an alloy layer (surface conductive layer 65) of Al layer (20 nm in thickness)/Ti layer (50 nm in thickness)/Au layer (500 nm in thickness) formed on both main surfaces to form the third composite substrate 3, the sapphire temporary supporting substrate (temporary supporting substrate 40) was removed from the third composite substrate 3 as such, and the resulting structure was divided into chips of 1 mm×1 mm (1 mm$^2$), and thus, LEDs (light emitting diodes) as semiconductor device 5 were obtained.

The resulting LED (semiconductor device 5) had, on the Si supporting substrate (supporting substrate 60) having the alloy layer (surface conductive layer 65) of Al layer (20 nm in thickness)/Ti layer (50 nm in thickness)/Au layer (500 nm in thickness) formed on both main surfaces, the ohmic electrode (conductive layer 50) formed of Al layer (20 nm in thickness)/Ti layer (50 nm in thickness)/Au layer (500 nm in thickness), the GaN layer (first group III nitride semiconductor layer 210), n type GaN layer 225, n type In$_{0.02}$Ga$_{0.98}$N buffer layer 226, light emitting layer 227 having a triple-period multiple quantum well (MQW) structure formed of the In$_{0.15}$Ga$_{0.85}$N well layer and the GaN barrier layer, p type Al$_{0.18}$GA$_{0.82}$N electron block layer 228, p type GaN contact layer 229 (second group III nitride semiconductor layer 220), p electrode (electrode 30) and pad electrode 33 formed in this order.

Comparative Example 2

Figure 10:
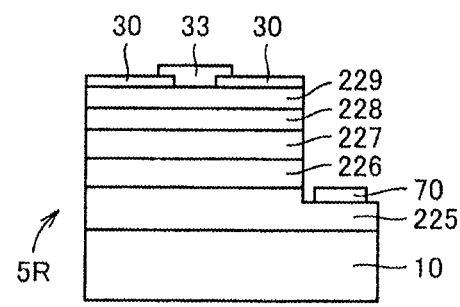
FIG. 10 is a schematic cross-sectional view showing another example of a method of manufacturing a typical semiconductor device.

Referring to FIG. 10, on a sapphire underlying substrate, n type GaN layer 225 having the thickness of 5 μm, n type In$_{0.02}$Ga$_{0.98}$N buffer layer 226 having the thickness of 100 nm, light emitting layer 227 having a three-period multiple quantum well (MQW) structure formed of an In$_{0.15}$Ga$_{0.85}$N well layer of 3 nm in thickness and a GaN barrier layer of 15 nm in thickness, p type Al$_{0.18}$Ga$_{0.82}$N electron block layer 228 of 20 nm in thickness and a p type GaN contact layer 229 of 50 nm in thickness were formed by MOVPE. Here, n type In$_{0.02}$Ga$_{0.98}$N buffer layer 226 and the GaN barrier layer were grown at 840° C., the In$_{0.15}$Ga$_{0.85}$N well layer was grown at 780° C., and other layers were grown at 1100° C.

Further, on a part of p type GaN contact layer 229, a p electrode (electrode 30) formed of Ni layer (5 nm in thickness)/Au layer (10 nm in thickness), having a square outer shape of 0.8 mm×0.8 mm with a portion for forming an n electrode cut-out and having an opening of 100 μm in diameter, was formed by vacuum deposition. A pad electrode 33 of Ti layer (50 nm in thickness)/Au layer (500 nm in thickness) having the diameter of 120 μm was formed by vacuum deposition to cover the opening of p electrode (electrode 30) and to be in contact with the p type GaN contact layer 229 and the p electrode (electrode 30).

Thereafter, a part of each of p type GaN contact layer 229, p type $Al_{0.18}Ga_{0.82}N$ electron block layer 228, light emitting layer 227 and n type $In_{0.02}Ga_{0.98}N$ buffer layer 226 (the portion corresponding to the outer circumferential region including the n electrode forming region of the p electrode (electrode 30)) was mesa-etched using RIE, so that part of n⁻type GaN layer 225 was exposed. On the n electrode forming region at the exposed portion of n type GaN layer 225, an n electrode (electrode 70) of Al layer (20 nm in thickness)/Ti layer (50 nm in thickness)/Au layer (500 nm in thickness) was formed by vacuum deposition, and the resulting structure was divided to chips of 1 mm×1 mm (1 mm²), and thus, LEDs (Light Emitting Diodes) as semiconductor device 5R were obtained. In the LED (semiconductor device 5R) of Comparative Example 2, the sapphire underlying substrate is insulating and, therefore, the n electrode (electrode 70) was formed on the same side as the p electrode (electrode 30) and, therefore, the light emitting area of LED (semiconductor device 5R) of Comparative Example 2 is smaller by 15% than the light emitting area of LED (semiconductor device 5) of Example 5. Here, in LEDs of Comparative Example 2 and Example 5, the light emitting area equals to the area of the portion of p electrode (electrode 30) where pad electrode 33 is not formed.

The emission intensity of LEDs (semiconductor devices) of Example 5 and Comparative Example 2 was measured using an integrating sphere. Luminance of the LED of Example 5 was about 1.6 times higher than the luminance of the LED of Comparative Example 2. In the LED of Example 5, the Al layer below the n type GaN layer 225 functions as a reflection film, and the light emitting area can be made wider because of the vertical device structure, so that decrease of internal quantum efficiency that becomes severer as the current density increases can be prevented. These are considered to be advantageous factors.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device, comprising:
a supporting substrate,
a conductive layer placed on said supporting substrate, and
one or more group III nitride semiconductor layers placed on said conductive layer; wherein
the supporting substrate is bonded to the one or more group III nitride semiconductor layers with the conductive layer being interposed between the supporting substrate and the one or more group III nitride semiconductor layers,
among said group III nitride semiconductor layers, a conductive-layer-neighboring group III nitride semiconductor layer adjacent to said conductive layer has n type conductivity, dislocation density of at most $1\times10^7 cm^{-2}$, and oxygen concentration of at most $5\times10^{18} cm^{-3}$, and
the conductive-layer-neighboring group III nitride semiconductor layer contains Al as a group III element forming the group III nitride.

2. The semiconductor device according to claim 1, wherein said conductive-layer-neighboring group III nitride semiconductor layer has oxygen concentration of at most $5\times10^{17} cm^{-3}$.

* * * * *